United States Patent
D'Abreu et al.

(10) Patent No.: US 9,406,346 B2
(45) Date of Patent: *Aug. 2, 2016

(54) SMART BRIDGE FOR MEMORY CORE

(75) Inventors: Manuel Antonio D'Abreu, El Dorado Hills, CA (US); Stephen Skala, Fremont, CA (US); Dimitris Pantelakis, Santa Clara, CA (US); Radhakrishnan Nair, Kerala (IN); Deepak Pancholi, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 554 days.

This patent is subject to a terminal disclaimer.

(21) Appl. No.: 13/247,532

(22) Filed: Sep. 28, 2011

(65) Prior Publication Data
US 2013/0007349 A1    Jan. 3, 2013

Related U.S. Application Data

(60) Provisional application No. 61/503,531, filed on Jun. 30, 2011.

(30) Foreign Application Priority Data

Jul. 26, 2011   (IN) ......................... 2124/MUM/2011

(51) Int. Cl.
| | |
|---|---|
| *G11C 5/02* | (2006.01) |
| *G11C 14/00* | (2006.01) |
| *G11C 29/04* | (2006.01) |
| *G11C 16/10* | (2006.01) |
| *G11C 16/26* | (2006.01) |
| *G06F 11/10* | (2006.01) |
| *G06F 13/16* | (2006.01) |

(52) U.S. Cl.
CPC .............. *G11C 5/02* (2013.01); *G06F 11/1068* (2013.01); *G06F 11/1072* (2013.01); *G06F 13/1668* (2013.01); *G11C 14/0063* (2013.01); *G11C 16/10* (2013.01); *G11C 16/26* (2013.01); *G11C 29/04* (2013.01); *G11C 2029/0411* (2013.01); *Y02B 60/1228* (2013.01)

(58) Field of Classification Search
CPC ...... G11C 5/02; G11C 14/0063; G11C 16/10; G11C 16/26; G11C 29/04; G11C 2029/0411; G06F 11/1068; G06F 11/1072; G06F 13/1668; Y02B 60/1228
See application file for complete search history.

(56) References Cited

U.S. PATENT DOCUMENTS

| | | |
|---|---|---|
| 5,812,803 A | 9/1998 | Pawlowski et al. |
| 6,081,447 A | 6/2000 | Lofgren et al. |
| 6,313,493 B1 | 11/2001 | Mori et al. |

(Continued)

FOREIGN PATENT DOCUMENTS

EP    1840722 A2    10/2007

OTHER PUBLICATIONS

Loh, Gabriel, 3D-Stacked Memory Architectures for Multi-Core Processors, 2008, IEEE, 12 pages (pp. 453-464).*

(Continued)

*Primary Examiner* — Gary W Cygiel
(74) *Attorney, Agent, or Firm* — Toler Law Group, PC

(57) ABSTRACT

An apparatus includes a first semiconductor device including a NAND flash memory core. The apparatus also includes a second semiconductor device including periphery circuitry associated with the NAND flash memory core.

32 Claims, 10 Drawing Sheets

(56) References Cited

U.S. PATENT DOCUMENTS

| | | | |
|---|---|---|---|
| 6,725,321 | B1 | 4/2004 | Sinclair et al. |
| 6,787,825 | B1 | 9/2004 | Gudesen et al. |
| 6,933,195 | B2 | 8/2005 | Lee |
| 6,990,040 | B2 | 1/2006 | Ohshima et al. |
| 7,516,295 | B2 | 4/2009 | In et al. |
| 7,574,648 | B2 | 8/2009 | Akiyama et al. |
| 7,631,245 | B2 | 12/2009 | Lasser |
| 7,894,229 | B2 | 2/2011 | Lahtinen et al. |
| 8,028,123 | B2 | 9/2011 | Kilzer et al. |
| 8,291,295 | B2 | 10/2012 | Harari et al. |
| 8,621,271 | B2 | 12/2013 | Grube et al. |
| 2005/0068802 | A1 | 3/2005 | Tanaka |
| 2006/0285422 | A1 | 12/2006 | Scheuerlein |
| 2007/0234172 | A1 | 10/2007 | Chiabrera |
| 2007/0250857 | A1 | 10/2007 | Frost-Ruebling et al. |
| 2007/0263442 | A1 | 11/2007 | Cornwell et al. |
| 2008/0126678 | A1 | 5/2008 | Mizushima |
| 2008/0153200 | A1* | 6/2008 | Sitaram .................. 438/106 |
| 2008/0310230 | A1* | 12/2008 | Kim et al. ............. 365/185.11 |
| 2008/0320214 | A1 | 12/2008 | Ma et al. |
| 2009/0020857 | A1 | 1/2009 | Cusack et al. |
| 2009/0063923 | A1 | 3/2009 | Gower et al. |
| 2009/0138654 | A1 | 5/2009 | Sutardja |
| 2009/0243732 | A1 | 10/2009 | Tarng et al. |
| 2010/0011159 | A1 | 1/2010 | Sutardja |
| 2010/0064111 | A1 | 3/2010 | Kunimatsu et al. |
| 2010/0091537 | A1 | 4/2010 | Best et al. |
| 2010/0110748 | A1 | 5/2010 | Best |
| 2010/0250831 | A1 | 9/2010 | O'Brien et al. |
| 2010/0325346 | A1 | 12/2010 | Huang |
| 2010/0325350 | A1 | 12/2010 | Sunaga |
| 2011/0040924 | A1 | 2/2011 | Selinger |
| 2011/0069526 | A1 | 3/2011 | Schuette |
| 2011/0161784 | A1 | 6/2011 | Selinger et al. |
| 2011/0167319 | A1 | 7/2011 | Jeddeloh |
| 2012/0023144 | A1 | 1/2012 | Rub |
| 2012/0131381 | A1 | 5/2012 | Eleftheriou et al. |
| 2012/0267689 | A1 | 10/2012 | Chen et al. |
| 2013/0159766 | A1 | 6/2013 | D'Abreu et al. |

OTHER PUBLICATIONS

International Preliminary Report on Patentability for International Application No. PCT/US2012/043465, issued Jan. 7, 2014, 7 pages.
Notice of Allowance and Fee(s) Due mailed Jan. 13, 2014 in U.S. Appl. No. 13/247,635, 9 pages.
Restriction Requirement mailed Mar. 11, 2014 in U.S. Appl. No. 13/247,592, 6 pages.
International Search Report and Written Opinion of the International Searching Authority mailed Sep. 27, 2012 in International Application No. PCT/US2012/043465, 12 pages.
U.S. Appl. No. 13/247,592, filed Sep. 28, 2011, 49 pages.
U.S. Appl. No. 13/247,635, filed Sep. 28, 2011, 50 pages.
International Search Report and Written Opinion of the International Searching Authority (EPO) for International Application No. PCT/US2012/065334, mailed Feb. 26, 2013, 11 pages.
Non-Final Office Action mailed Sep. 9, 2013 in U.S. Appl. No. 13/247,635, 19 pages.
Non-Final Office Action mailed Oct. 24, 2013 in U.S. Appl. No. 13/331,853, 14 pages.
D'Abreu, Manuel Antonio et al. "Smart Bridge for Memory Core," U.S. Appl. No. 14/246,548, filed Apr. 7, 2014, 48 pages.
D'Abreu, Manuel Antonio et al. "Smart Bridge for Memory Core," U.S. Appl. No. 14/246,593, filed Apr. 7, 2014, 48 pages.
D'Abreu, Manuel Antonio et al. "Smart Bridge for Memory Core," U.S. Appl. No. 14/246,650, filed Apr. 7, 2014, 49 pages.
D'Abreu, Manuel Antonio et al. "Smart Bridge for Memory Core," U.S. Appl. No. 14/246,680, filed Apr. 7, 2014, 49 pages.
Notice of Allowance and Fee(s) Due mailed Apr. 18, 2014 in U.S. Appl. No. 13/247,635, 9 pages.
Final Office Action mailed Apr. 24, 2014 in U.S. Appl. No. 13/331,853, 17 pages.
Non-Final Office Action mailed May 9, 2014 in U.S. Appl. No. 13/247,592, 15 pages.
Non-Final Office Action mailed Jun. 13, 2014 in U.S. Appl. No. 14/246,548, 13 pages.
Non-Final Office Action mailed Jun. 16, 2014 in U.S. Appl. No. 14/246,680, 13 pages.
Non-Final Office Action mailed Jun. 19, 2014 in U.S. Appl. No. 14/246,593, 9 pages.
Non-Final Office Action mailed Jun. 19, 2014 in U.S. Appl. No. 14/246,650, 12 pages.
International Preliminary Report on Patentability for International Application No. PCT/US2012/065334, issued Jun. 24, 2014, 7 pages.
Non-Final Office Action mailed Oct. 7, 2014 in U.S. Appl. No. 13/331,853, 14 pages.
Notice of Allowance and Fee(s) Due mailed Jul. 29, 2014 in U.S. Appl. No. 13/247,635, 9 pages.
Notice of Allowance and Fee(s) Due mailed Apr. 14, 2015 in U.S. Appl. No. 14/246,593, 10 pages.
Notice of Allowance and Fee(s) Due mailed May 19, 2015 in U.S. Appl. No. 14/246,548, 10 pages.
Notice of Allowance and Fee(s) Due mailed May 12, 2015 in U.S. Appl. No. 14/246,680, 11 pages.
Notice of Allowance and Fee(s) Due mailed Apr. 6, 2015 in U.S. Appl. No. 13/331,853, 5 pages.
Notice of Allowance and Fee(s) Due mailed Mar. 31, 2015 in U.S. Appl. No. 14/246,650, 8 pages.
Final Office Action mailed Jan. 14, 2015 in U.S. Appl. No. 14/246,593, 10 pages.
Notice of Allowance and Fee(s) Due mailed Jan. 22, 2015 in U.S. Appl. No. 14/246,680, 11 pages.
Final Office Action mailed Dec. 29, 2014 in U.S. Appl. No. 14/246,548, 15 pages.
Final Office Action mailed Dec. 22, 2014 in U.S. Appl. No. 13/247,592, 16 pages.
Notice of Allowance and Fee(s) Due mailed Dec. 3, 2014 in U.S. Appl. No. 14/246,650, 9 pages.
Notice of Allowance and Fee(s) Due mailed Nov. 5, 2014 in U.S. Appl. No. 13/247,635, 9 pages.
Notice of Allowance and Fee(s) Due mailed Mar. 10, 2015 in U.S. Appl. No. 13/247,635.
Notice of Allowance and Fee(s) Due mailed Apr. 14, 2015 in U.S. Appl. No. 14/246,593, 10 pp.
Notice of Allowance and Fee(s) Due mailed Mar. 31, 2015 in U.S. Appl. No. 14/246,650, 8 pp.
Notice of Allowance and Fee(s) Due mailed Aug. 19, 2015 in U.S. Appl. No. 14/246,680, 12 pages.
Notice of Allowance and Fee(s) Due mailed Aug. 19, 2015 in U.S. Appl. No. 13/331,853, 13 pages.
Notice of Allowance and Fee(s) Due mailed Jul. 2, 2015 in U.S. Appl. No. 13/247,592, 7 pages.
Notice of Allowance and Fee(s) Due mailed Jul. 9, 2015 in U.S. Appl. No. 14/246,650, 8 pages.
Notice of Allowance and Fee(s) Due mailed Aug. 7, 2015 in U.S. Appl. No. 14/246,593, 9 pages.
Notice of Allowance and Fee(s) Due mailed Jun. 26, 2015 in U.S. Appl. No. 13/247,635, 9 pages.

* cited by examiner

SMART BRIDGE FOR MEMORY CORE

REFERENCE TO EARLIER-FILED APPLICATIONS

This application claims priority from U.S. Provisional Patent Application No. 61/503,531, filed Jun. 30, 2011, and from Indian Application No. 2124/MUM/2011, filed Jul. 26, 2011. The contents of each of these applications are incorporated by reference herein in their entirety.

FIELD OF THE DISCLOSURE

The present disclosure is generally related to data storage and retrieval.

BACKGROUND

The capability to store data in memory devices continually improves with advances in technology. For example, flash memory enables non-volatile storage of data at a semiconductor device that may include one or more memory cores. A memory die that includes one or more NAND flash memory cores conventionally includes periphery circuitry, such as one or more charge pumps, state machines, and row decoders for each memory core, as illustrative examples. The periphery circuitry enables the memory die to be responsive to control signals from a memory controller to store and retrieve data. However, the periphery circuitry occupies space on the memory die that may otherwise be used for flash data storage elements.

SUMMARY

A smart bridge device includes periphery circuitry for a NAND flash memory core that is located on a separate die than the smart bridge device. The smart bridge device may implement the periphery circuitry using CMOS technology rather than NAND flash technology. Circuitry such as data latches and state machines that are traditionally implemented on a same die as a NAND flash memory core may instead be implemented on the smart bridge device, enabling increased storage capability on the NAND flash memory core. Circuitry such as ECC engines that are traditionally implemented on a memory controller may also be implemented on the smart bridge device, enabling increased ECC capability in implementations that include multiple memory cores and multiple smart bridge devices.

DETAILED DESCRIPTION

Figure 1:
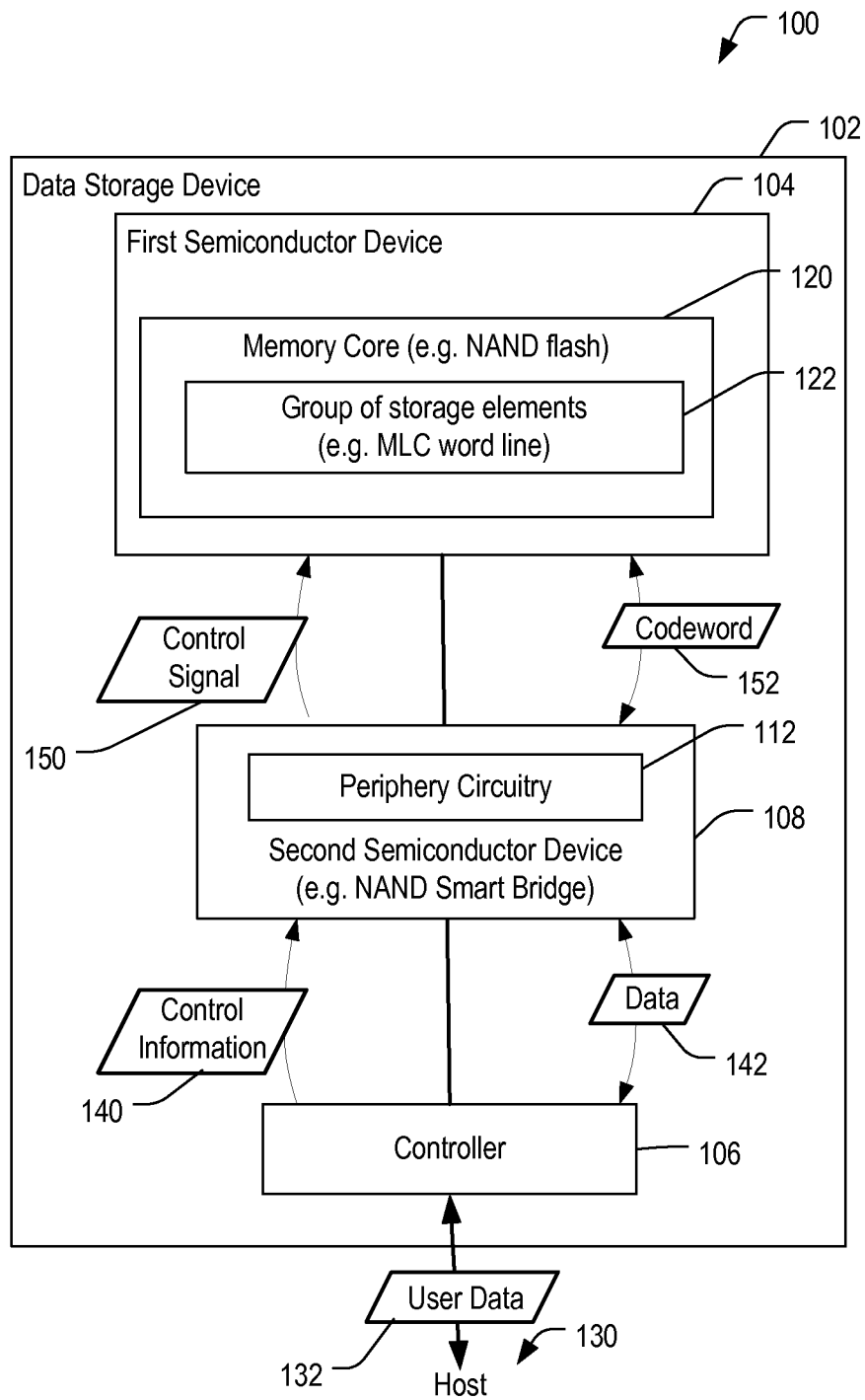
FIG. 1 is a block diagram of a particular illustrative embodiment of a system that includes a data storage device having a first semiconductor device including a memory core and a smart bridge device including periphery circuitry for the memory core.

Referring to FIG. 1, a particular embodiment of an apparatus 100 is shown. The apparatus 100 includes a data storage device 102. The data storage device 102 includes a first semiconductor device 104 and a second semiconductor device 108. The first semiconductor device 104 includes a memory core 120 (e.g. a NAND flash memory core) that includes storage elements, such as a representative group of storage elements 122. An example of the group of storage elements 122 is a multilevel cell (MLC) word line. The data storage device 102 further includes a controller 106, and the data storage device 102 is selectively connected to a representative host 130.

The second semiconductor device 108 includes periphery circuitry 112. The periphery circuitry 112 is associated with the NAND flash memory core 120 of the first semiconductor device 104. In addition, the second semiconductor device 108 may comprise a NAND smart bridge that may perform NAND management device functions. For example, the second semiconductor device 108 including the periphery circuitry 112 may perform management functions with respect to the memory core 120 of the first semiconductor device 104.

The periphery circuitry 112 may include a variety of different components, such as an error correction engine, a multi-ported static random access memory (SRAM), control logic such as a finite state machine or a micro-programmed engine, and a decoder associated with the memory core 120 (e.g. a row decoder configured to decode at least a portion of an address and to select a row of the memory core 120). In addition, the periphery circuitry 112 may include other elements such as a charge pump that is configured to generate voltage to be applied to at least one of a word line, a bit line, and a source line of the memory core 120. Further details of implementations of the periphery circuitry 112 are described with respect to FIG. 2.

In a particular embodiment, the first semiconductor device 104 is a first die and the second semiconductor device 108 is a second die. The first die and the second die may be packaged together in a single package. In this case, the first semiconductor device 104 and the second semiconductor device 108 may be disposed in a single package within the data storage device 102.

The controller 106 may be a memory controller that includes a processor, a host interface, and an interface to the second semiconductor device 108. The controller 106 may communicate user data 132 to the host 130. In addition, the controller 106 may send control information 140 to the second semiconductor device 108 and may send data 142 to the second semiconductor device 108. Thus, the controller 106 may communicate with the host 130 and with the second semiconductor device 108.

During operation, the second semiconductor device 108 may receive the data 142 from the controller 106, and the data 142 may be allocated to be stored at the memory core 120 of the first semiconductor device 104. The periphery circuitry 112 within the second semiconductor device 108 may be used to send a control signal 150 from the second semiconductor device 108 to the memory core 120 at the first semiconductor device 104. The periphery circuitry 112 may send the control signal 150 to the first semiconductor device 104 and may send a codeword 152 to the memory core 120 of the first semiconductor device 104.

The codeword 152 corresponds to and may be derived from the received data 142. For example, an error correction coding (ECC) encoder within the periphery circuitry 112 may process the received data 142 and may generate the codeword 152. The periphery circuitry 112 may send the codeword 152 to the memory core 120 for the codeword 152 to be stored therein. The memory core 120 within the first semiconductor device 104 is responsive to the control signal 150 to store the codeword 152 within the memory 120. For example, the control signal 150 may indicate a write operation to the group of storage elements 122, and the codeword 152 may be stored within the group of storage elements 122.

During a memory read operation, the second semiconductor device 108 may send a read control signal 150 to the memory core 120 at the first semiconductor device 104. In response to sending the read control signal 150, the second semiconductor device 108 may receive a representation of a codeword from the memory core 120. The representation of the codeword is received at the periphery circuitry 112 which corresponds to the memory core 120. Upon receipt of the representation of the codeword 152, circuitry within the periphery circuitry 112 (e.g. an ECC decoder) may process the received representation of the codeword 152 to generate data to be communicated to the controller 106. For example, an ECC decoder within the periphery circuitry 112 may receive a representation of the codeword 152 and may generate corresponding data 142 to be communicated to the controller 106. Thus, the second semiconductor device 108 (e.g. a NAND smart bridge) may be used to perform both read and write operations with respect to the memory core 120 of the first semiconductor device 104. In addition, the second semiconductor device 108 may communicate with the controller 106, which in turn may communicate with the external host 130.

The first semiconductor device 104 may be fabricated using a first type of process technology while the second semiconductor device 108 may be fabricated using a second type of process technology. For example, the first process technology may be NAND flash process technology while the second semiconductor technology may be multiple metal interconnect CMOS technology. Using different process technologies for the first and second semiconductor devices 104 and 108, respectively, allows the relaxation of certain design rules with respect to the memory core 120. Relaxing the design rules for the memory core 120 enables design of devices increased spacing between individual cells and word lines, thus reducing intercell/interwordline interference. Thus, the first semiconductor device 104 may be designed to achieve greater performance and endurance than data storage devices that include the periphery circuitry on the same die as the memory core.

In addition, by use of the second semiconductor device 108, additional ECC encoders and decoders, or alternatively ECC encoders/decoders having a higher error correction capability, may be disposed within the periphery circuitry 112 of the second semiconductor device 108. Thus, a majority of the first semiconductor device 104 may be dedicated to the memory core 120 while additional circuitry to provide additional features and functionality is implemented in the second semiconductor device 108. In addition, the periphery circuitry 112 may include additional memory, such as SRAM, to improve throughput and error correction processing capabilities. The SRAM can be used to analyze data stored in adjacent word lines, support and manage multiple reads of a wordline with different read voltages, and implementation of novel error correcting algorithms.

The second fabrication process of the second semiconductor device 108 may be selected to effectively manufacture devices with the particular circuit components, such as those components within the periphery circuitry 112, to be disposed on the second semiconductor device 108. For example, the multilevel metal interconnect CMOS process may be used for implementations of analog and other circuitry of the periphery circuitry 112. In addition, implementation of the periphery circuitry 112 using standard CMOS processes allows the addition of significant amounts of SRAM, and new functionality while maintaining a small device size.

While a single controller 106, a single second semiconductor device 108, and a single memory core 120 are shown in FIG. 1, it should be understood that the second semiconductor device 108 may support more than one memory core 120 and the controller 106 may support more than one second semiconductor device 108. In addition, while the periphery circuitry 112 has been described with respect to an ECC encoder and an ECC decoder corresponding to the memory core 120, it should be understood that the periphery circuitry 112 may include multiple ECC encoders and ECC decoders to support multiple memory cores (e.g. cores other than the single memory core 120 illustrated in FIG. 1). Thus, the periphery circuitry 112 may include significant ECC processing capabilities to support one or more than one memory core of a memory device, such as the first semiconductor device 104.

Figure 2:
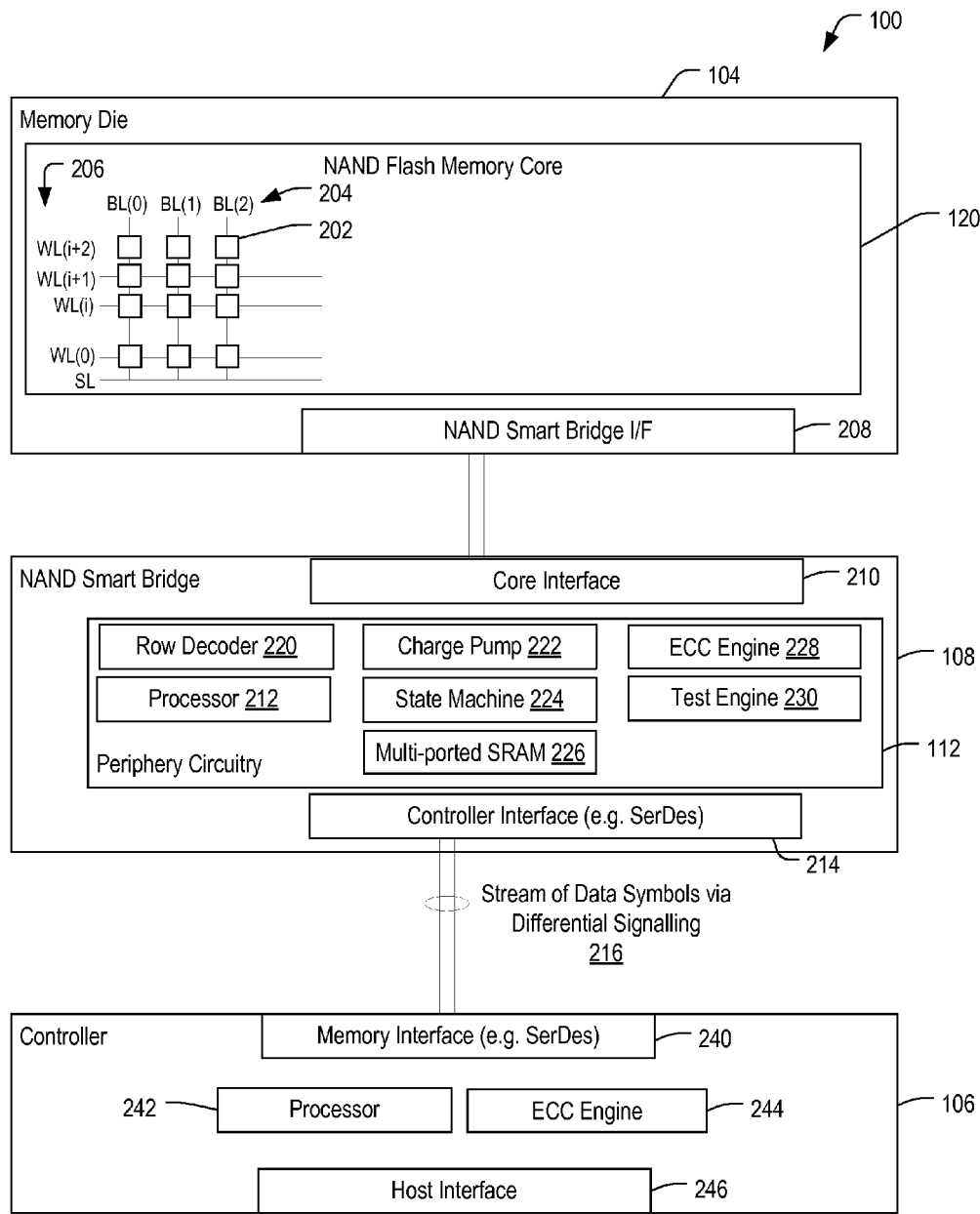
FIG. 2 is a block diagram illustrating a particular embodiment of the data storage device of FIG. 1.

Referring to FIG. 2, further details of a particular embodiment of the apparatus 100 is illustrated. FIG. 2 depicts various components previously shown with respect to FIG. 1 and such common components have the same reference numbers as in FIG. 1. For example, the memory die 104, the NAND flash memory core 120, the periphery circuitry 112, and the controller 106 have the same reference numbers as indicated in FIG. 1. In addition, each of these components has the same structure and capabilities as described with respect to FIG. 1.

FIG. 2 further depicts rows and columns of the NAND flash memory core 120 of the first semiconductor device 104 (referred to as memory die 104 in FIG. 2). For example, the NAND flash memory core 120 within the memory die 104 includes storage elements that are addressable by word lines 206 and bit lines 204, and a representative cell 202 corresponding to a particular word line and bit line is shown. The memory die 104 further includes a NAND smart bridge interface 208. The NAND smart bridge interface 208 is coupled to a core interface 210 of the second semiconductor device 108 (referred to as a NAND smart bridge device 108 in FIG. 2).

The NAND smart bridge device 108 includes the periphery circuitry 112, a core interface 210, and a controller interface 214. In a particular embodiment, the controller interface 214 is a serializer/deserializer (SERDES) interface. The periphery circuitry 112 includes a processor 212, a row decoder 220, a charge pump 222, a state machine 224, a multi-ported SRAM 226, an ECC engine 228, and a test engine 230 that is be configured to test an operation of the NAND flash memory core 120. While the periphery circuitry 112 shows a variety of components, it should be understood that the periphery circuitry 112 may include less components or additional components. For example, the periphery circuitry 112 may include at least one of a processor, an ECC engine, a row decoder, a charge pump, and a multi-ported static random access memory (SRAM).

The controller 106 includes a memory interface 240, a processor 242, an ECC engine 244, and a host interface 246. The host interface 246 of the controller 106 may be selectively coupled to a host, such as the representative host 130 of FIG. 1. The memory interface 240 may, in a particular embodiment, be serial using a serializer/deserializer (SERDES) interface. The memory interface 240 communicates with the controller interface 214 of the NAND smart bridge 108. For example, the memory interface 240 and the controller interface 214 may each communicate a stream of data symbols 216 via differential signaling, as shown in FIG. 2. Each data symbol in the stream of data signals 216 may comprise a differential signal applied to a pair of communication lines coupled between the first serializer/deserializer (SERDES) communication interface (one of the memory interface 240 and the controller interface 214) and the second serializer/deserializer (SERDES) communication interface (e.g. the other of the memory interface 240 and the controller interface 214). In some implementations, the core interface 210 and the NAND smart bridge interface 208 also communicate via a differential signaling protocol, such as a serializer/deserializer communication interface (not shown).

In a particular embodiment, the controller 106 is a flash memory controller and is used in connection with the NAND flash memory core 120 of the memory die 104 and communicates via the NAND smart bridge 108 to the NAND flash memory core 120. For example, the controller 106 may communicate with the NAND smart bridge 108 using the serializer/deserializer (SERDES) interface 240 as described. While both the NAND smart bridge 108 and the controller 106 include ECC engines (e.g. ECC engine 228 and ECC engine 244), the ECC engines in the respective devices (i.e. NAND smart bridge 108 and controller 106) may either be a similar type of ECC engine or may be distinct types of ECC engines (e.g. a Reed-Solomon (RS) engine, a Bose-Chaudhuri-Hocquenghem (BCH) engine, a concatenated or a convolutional code engine (e.g. a turbo code engine), or any other type of ECC engine). For example, an ECC engine with enhanced error correction capability may be implemented for the ECC engine 228 within the NAND smart bridge 108 while an ECC engine with a standard level of error correction capability may be implemented for the ECC engine 244 within the controller 106. Use of enhanced error correction ECC processing within the ECC engine 228 enables the controller 106 to manage or otherwise interface with multiple NAND smart bridge devices, and each of the NAND smart bridge devices may support multiple memory devices. For example, use of the enhanced error correction ECC engine 228 may enable a reduced processing burden on the ECC engine 244 within the controller 106, thereby enabling the controller 106 to support multiple devices.

During operation, the controller 106 may receive instructions and/or data from a host device, such as the host 130 of FIG. 1. The instructions and/or data may be received at the host interface 246 for interaction with the memory die 104. The controller 106 may be configured to process the received instructions and/or data, such as by performing an encoding operation at the ECC engine 244, and to send the processed data to the NAND smart bridge 108 via the memory interface 240.

The NAND smart bridge 108 may be responsive to the stream of data symbols 216 that are received via a differential pair of communication lines coupled to the controller interface 214. The NAND smart bridge 108 may be configured to process the received stream of data symbols 216 at the controller interface 214 to affect operation of one or more components at the periphery circuitry 112. For example, when the NAND smart bridge 108 receives an instruction to store data to the NAND flash memory core 120, the NAND smart bridge 108 may be configured to cache at least a portion of received data at the multi-ported SRAM 226, to encode data to be stored at the NAND flash memory core 120 at the ECC engine 228, and to initiate a data store operation at the NAND flash memory core 120 by sending instructions and encoded data to the memory die 104 via the core interface 210.

In addition, one or more other components may operate at the NAND smart bridge 108. For example, the row decoder 220 may be used to select a particular row 206 of the NAND flash memory core 120. As another example, the charge pump 222 may be operated at the NAND smart bridge 108 rather than at the memory die 104. The multi-ported SRAM 226 may be used as a cache memory, such as when the periphery circuitry 112 is configured to store data to the multi-ported SRAM 226 and to retrieve data from the multi-ported SRAM 226 in accordance with a cache policy, such as a least recently used (LRU) replacement policy. Operation of the periphery circuitry 112, such as determination of specific sequences of operations to perform in response to a read command or a write command, may be controlled by the state machine 224, by a microprocessor 212, or a combination thereof.

The NAND flash memory core 120 may be responsive to data and instructions from the NAND smart bridge 108 to store data, such as the codeword 152 of FIG. 1, at a selected word line, such as the I word line (WL (i)). As another example, the NAND flash memory core 120 may be responsive to a read command to enable one or more bit lines BLs 204 and to initiate a sensing operation to provide data from the memory cells, such as the representative cell 202, to the NAND smart bridge 108 for error correction processing at the ECC engine 228. For example, the data to be stored at the NAND flash memory core 120 may be encoded at the ECC engine 228 using a first ECC encoding operation prior to storage. The periphery circuitry 112 includes the error correction (ECC) engine 228 and is configured to initiate a decoding operation of a received representation of a codeword at the ECC engine 228. The periphery circuitry 112 may further send data generated at the ECC engine 228 to the controller 106 that is coupled to the second semiconductor device (i.e. the NAND smart bridge 108). For example, data read from the NAND flash memory core 120 may be decoded using the ECC engine 228. After decoding the data at the ECC engine 228, the data may be partially re-encoded at the ECC engine 228 for transfer to the controller 106. In an alternative implementation, the decoded data resulting from a first ECC operation at the NAND smart bridge 108 may be a codeword that is decodable by the ECC engine 244. A second decoding of the data may be performed as a second ECC operation at the ECC engine 244. The first ECC operation may use a different error correction code than the second ECC operation.

The NAND smart bridge 108, located between the controller 106 and the memory die 104, enables operations that may otherwise have been performed at the controller 106 or at the memory die 104 to be performed at the NAND smart bridge 108. For example, the NAND smart bridge 108 may receive a serial stream of data symbols 216 at the controller serializer/deserializer (SERDES) communication interface 214. The controller SERDES interface 214 may deserialize the serial stream of data symbols 216 to generate data to be stored at the memory core 120. The NAND smart bridge 108 may send a control signal and a codeword from the NAND smart bridge 108 to the memory core 120. For example, the control signal and the codeword may correspond to data to be stored at the memory core 120. To illustrate, data that is received via the controller interface 214 may be encoded at the ECC engine 228 to generate a codeword, as opposed to a conventional system where a codeword is generated at a memory controller. The codeword is transmitted via the core interface 210 for storage at the NAND flash memory core 120. The serial stream of data symbols 216 may be received from the memory controller 106 via the controller interface 214.

As another example, the NAND smart bridge 108 may receive data from the memory core 120 of the memory die 104. The data may be received at the periphery circuitry 112 that corresponds to the memory core 120. The data may be processed at the NAND smart bridge 108, such as by at least partially decoding the data at the ECC engine 228 (as opposed to a conventional system where data is decoded at a memory controller). The processed data may be sent to the controller 106 that is coupled to the NAND smart bridge 108 via the controller interface 214.

For example, the received data may include a representation of a codeword and the NAND smart bridge 108 may initiate a decode operation of the representation of the codeword at the ECC engine 228. The received data may have initially been stored at the memory core 120 as a codeword that includes redundant data to enable error correction and decoding. Data may be retrieved as a representation of the codeword that may include one or more corrupted bits. The ECC engine 228 may initiate a decode operation in response to receiving the representation of the codeword at an input of the ECC engine 228 and in response to receiving a control signal to perform a decode operation. The ECC engine 228 may be configured to generate an output of decoded data, or alternatively, an indication of an error condition of the decode operation, such as when an error correction capability of the ECC engine 228 has been exceeded. Data that is generated at the ECC engine 228 may be sent to the controller 106. The controller 106 may be configured to perform further processing of the data, such as second decoding at the ECC engine 244, and may provide data to an external host device, such as via the host interface 246.

Further, the periphery circuitry 112 of the NAND smart bridge 108 may be configured to concurrently process multiple word lines of data at the multi-ported SRAM 226. For example, the processor 212 or the state machine 224 may be configured to process the multiple word lines of data from the NAND flash memory core 120 to detect at least one of an interference condition, a program disturb condition, and a read disturb condition. To illustrate, one or more detected conditions may correspond to values stored at cells at neighboring word lines of the NAND flash memory core 120. As another example, multiple word lines of data corresponding to a single word line read with different sets of read voltages may be read from the NAND flash memory core 120 into the multi-ported SRAM 226, and the periphery circuitry 112 may be configured to perform error correction processing of the multiple word lines of data in the multi-ported SRAM 226. As another example, the periphery circuitry 112 may be configured to process multiple word lines of data in the multi-ported SRAM 226 to detect specific data patterns. As another example, the periphery circuitry 112 may be configured to process multiple word lines of data in the multi-ported SRAM 226 to scramble data to be stored to the NAND flash memory core 120.

Figure 3:
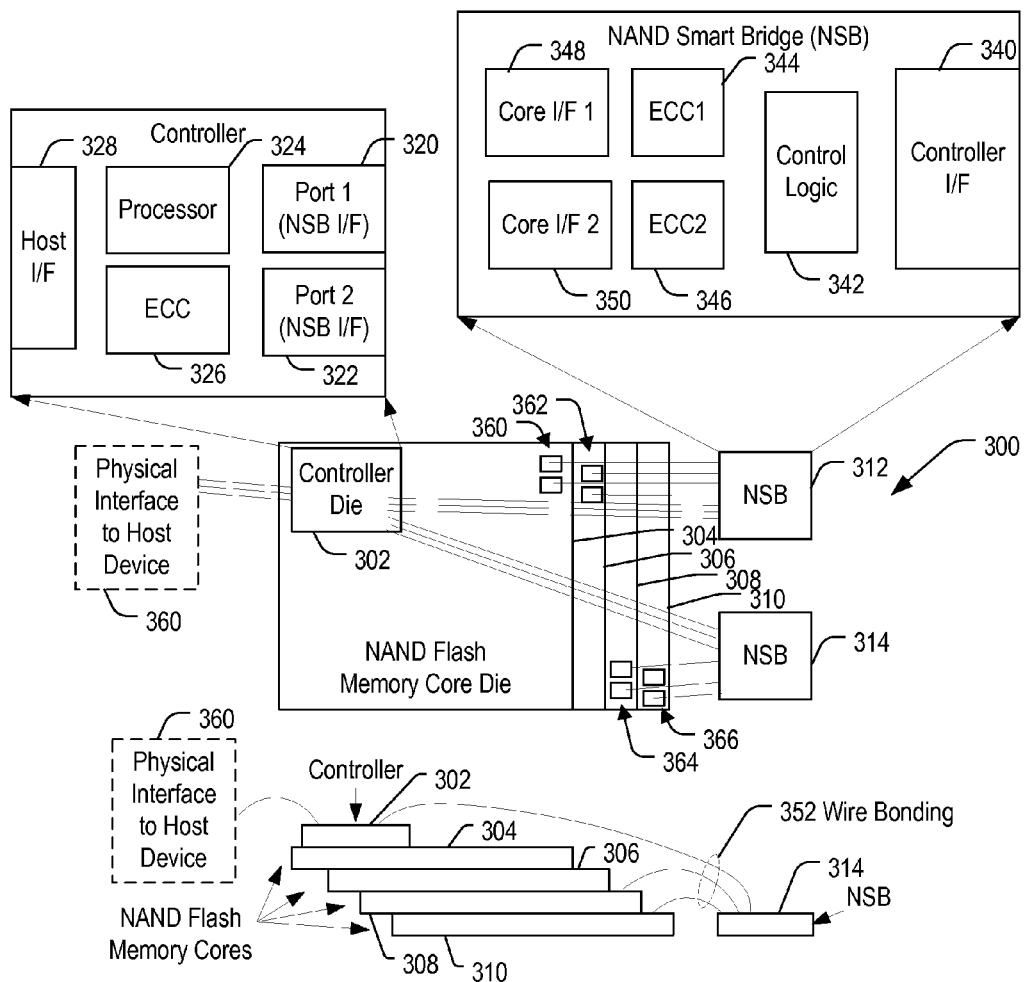
FIG. 3 is a general diagram illustrating a top view and a side elevational view of a particular embodiment of an arrangement of dies that may be included in the data storage device of FIG. 1.

Referring to FIG. 3, a particular illustrative embodiment of an apparatus 300 having a multi-die configuration is depicted in a top view and a side elevational view. The apparatus 300 includes a first memory die 304 that includes a first memory core, a second memory die 306 that includes a second memory core, a third memory die 308 that includes a third memory core, and a fourth memory die 310 that includes a fourth memory core. For example, the memory cores may be NAND flash memory cores. The first memory die 304 and the second memory die 306 are coupled to a first periphery die 312 (while a NAND smart bridge (NSB) 312 is shown in FIG. 3, the NSB 312 is an example of a periphery die and any other type of periphery die may be used and will be described herein as periphery die 312). The third memory die 308 and the fourth memory die 310 are coupled to a second periphery die 314 (e.g. a NAND smart bridge). The first periphery die 312 and the second periphery die 314 are coupled to a controller die 302. The controller die 302 may be coupled to a physical interface 360 to a host device.

Components of the apparatus 300 may correspond to components of the device 100 illustrated in FIGS. 1-2. For example, the controller die 302 may correspond to the controller 106. The first periphery die 312 may correspond to a first instance of the NAND smart bridge 108, and the second periphery die 314 may correspond to a second instance of the NAND smart bridge 108. Each of the memory dies 304-310 may correspond to the memory die 104 and may be flash memory core dies. As illustrated, the first periphery die 312 is coupled to a representative first set of pads 360 at the first memory die 304 via wire bonds 352. The first periphery die 312 is also coupled to a second representative set of pads 362 at the second memory die 306 via wire bonds 352. The second periphery die 314 is coupled to a third representative set of pads 364 at the third memory core 308 via wire bonds 352. The second periphery die 314 is coupled to a fourth representative set of pads 366 at the fourth memory core 310 via wire bonds 352. The first periphery die 312 and the second periphery die 314 are each coupled to the controller die 302 via wire bonds 352. Although connections between dies in FIG. 3 are illustrated as wire bonds 352, one or more other techniques may be used to enable electrical coupling between two or more of the dies 302-314, such as flip chip bumps, through-silicon vias, one or more other electrical connection techniques, or any combination thereof.

The first periphery die 312 is illustrated in an enlarged view as including a controller interface 340, periphery circuitry corresponding to a first memory core, and periphery circuitry corresponding to a second memory core. For example, the first periphery die 312 may include a NAND smart bridge that includes control logic 342, a first ECC engine 344, a second ECC engine 346, a first core interface 348, and a second core interface 350. The first ECC engine 344 may be part of first periphery circuitry (such as the periphery circuitry 112 of FIGS. 1-2), corresponding to a first memory core at the first memory die 304. The first core interface 348 may be configured to enable the first periphery die 312 to communicate control signals and data with the first memory core of the first memory die 304. The second ECC engine 346 may be part of second periphery circuitry corresponding to the second memory core at the second memory die 306. The second core interface 350 may be configured to enable the first periphery die 312 to communicate control signals and data with the second memory core at the second memory die 306.

The first periphery die 312 may be responsive to a memory controller at the controller die 302. For example, in response to instructions received from the controller die 302, the first periphery die 312 may be configured to initiate a first memory operation at the first memory core and a second memory operation at the second memory core. To illustrate, the first periphery die 312 may be configured to receive instructions from the controller die 302, such as write instructions to write a first data word to the first memory core at the first memory die 304 and to write a second data word to the second memory core at the second memory core die 306. The first periphery die 312 may generate control signals that are operative to cause the first memory core at the first memory die 304 and the second memory core at the second memory core die 306 to perform concurrent program operations, concurrent read operations, concurrent program and read operations, or concurrent erase operations.

The second periphery die 314 may be configured in a substantially similar manner as the first periphery die 312. The second periphery die 314 may be responsive to the controller die 302 to perform memory operations at the third memory core at the third memory die 308 and at the fourth memory core at the fourth memory die 310.

The controller die 302 is illustrated in an enlarged view as including a memory controller having a first port 320, such as a first NAND smart bridge interface (NSB I/F), a second port 322, such as a second NAND smart bridge interface (NSB I/F), a processor 324, an ECC engine 326, and a host interface 328.

Communication between the controller die 302 and each of the first periphery die 312 and the second periphery die 314 may be enabled via a serializer/deserializer communication interface. For example, the controller interface 340 of the first periphery die 312 may be a serializer/deserializer communication interface that is coupled to the first port 320 of the controller die 302. The first port 320 may also be a serializer/deserializer (Serdes) communication interface. In some embodiments, the first core interface 348 and the second core interface 350 may include serializer/deserializer communication interfaces. However, in other embodiments, communication between the first periphery die 312 and the memory cores of the first and second memory dies 304, 306 may occur via a communication interface other than a serializer/deserializer communication interface.

Each of the first periphery die 312 and the second periphery die 314 are configured to generate control signals to control operation of one or more memory cores. For example, the first periphery die 312 is configured to generate control signals to control operation of the first memory core at the first memory die 304 and to control operation of the second memory core at the second memory die 306. The first periphery die 312 and the second periphery die 314 may be responsive to the controller die 302. For example, the first periphery die 312 may be responsive to the memory controller at the controller die 302 to initiate a first memory operation at the first memory core at the first memory die 304 and to initiate a second memory operation at the second memory core at the second memory die 306. The first periphery die 312 may be configured to perform the first memory operation substantially concurrently with performing the second memory operation. For example, the first periphery die 312 may be configured to receive data from the memory controller at the controller die 302 and to initiate a first memory operation to store a first portion of the data to the first memory core at the first memory die 304 and to concurrently initiate a second memory operation to store a second portion of the data to the second memory core at the second memory die 306.

As another example, the first periphery die 312 may be configured to receive a request from the memory controller at the controller die 302 to retrieve stored data. The first periphery die 312 may be responsive to the request to retrieve the stored data by initiating a first memory operation that includes reading a first portion of the stored data from the first memory core at the first memory die 304 and by initiating a second memory operation that includes reading a second portion of the stored data from the second memory core at the second memory die 306. The first periphery die 312 may be configured to process the first portion of the stored data and the second portion of the stored data and to combine the processed first and second portions to be provided to the controller die 302.

As another example, the periphery die 312 may be configured to receive a request from the memory controller at the controller die 302 to erase stored data. In response, the periphery die 312 may initiate a first memory operation that includes erasing the first portion of the stored data from the first memory core at the first memory die 304. The periphery die 312 may also initiate a second memory operation that includes erasing the second portion of the stored data from the second memory core of the second memory die 306. The first and second erase operations may occur during a single time period.

The periphery die 312 may also be configured to concurrently perform different types of operations at different memory dies. As an example, the periphery die 312 may initiate a first memory operation that includes a write operation of first data to the first memory die 304 and a second memory operation that includes a read operation of second data from the second memory die 306. The periphery die 312 may be configured to perform the write operation substantially concurrently with performing the read operation (i.e. the write operation and the read operation may occur during a single time period).

The control logic 342 of the first periphery die 312 may include control circuitry that is configured to initiate a first ECC operation at the first ECC engine 344 substantially concurrently with initiating a second ECC operation at the second ECC engine 346. For example, the first ECC operation may include encoding first data at the first ECC engine 344 and the second ECC operation may include encoding second data at the second ECC engine 346. To illustrate, the first data may be a first portion of received data from the memory controller at the controller die 302, and the second data may be a second portion of the received data from the memory controller at the controller die 302. The first portion and the second portion of retrieved data may be routed by the control logic 342 to the first ECC engine 344 and to the second ECC engine 346, respectively.

The control logic 342 may be configured to initiate an encode operation of the first portion of the received data at the first ECC engine 344 substantially concurrently with initiating an encode operation of the second portion of the received data at the second ECC engine 346. The encode ECC operations may result in first and second codewords being generated. The first periphery die 312 may be configured to store the first codeword generated by the first ECC operation to the first memory core at the first memory die 304 by operation of the control logic 342 to control transfer of the first codeword via the first core interface 348. Similarly, the first periphery die 312 may be configured to store the second codeword generated by the second ECC operation to the second memory core at the second memory die 306 by operation of the control logic 342 to control transfer of the second codeword via the second core interface 350.

The first periphery die 312 may be configured to decode first data at the first ECC engine 344 and, substantially concurrently with decoding the first data, to decode second data at the second ECC engine 346. For example, the first periphery die 312 may be configured to retrieve first data, such as a representation of a first codeword, via the first core interface 348. The first periphery die 312 may be configured to receive second data, such as representation of the second codeword, from the second memory die 306 via the second core interface 350. Upon receiving the first and second data, the control logic 342 may be configured to direct the first data to an input of the first ECC engine 344 and to direct the second data to an input of the second ECC engine 346, for substantially concurrent decoding of the first data and the second data. Outputs of decode operations at the first ECC engine 344 and at the second ECC engine 346 may result in decoded data being routed by the control logic 342 to the controller die 302 via the controller interface 340.

As illustrated in the side elevational view of the apparatus 300, the controller die 302 is stacked on the first memory die 304. The first memory die 304 is stacked on the second memory die 306. The second memory die 306 is stacked on the third memory die 308, and the third memory die 308 is stacked on the fourth memory die 310. The second periphery die 314 is coupled to the controller die 302, the third memory die 308, and the fourth memory die 310 via the wire bonds 352. Each of the memory dies 304-310 are illustrated as being offset from each other to enable the representative sets of pads 360, 362, 364, 366 to be accessible for wire bonding to the respective periphery dies 312, 314.

As illustrated in the top view of the apparatus 300, the controller die 302, the first periphery die 312, and the second periphery die 314 are each smaller than each memory die 304, 306, 308, and 310. Although each of the periphery dies 312, 314 is illustrated as being coupled to two memory dies, in other embodiments each periphery die 312, 314 may instead be coupled to a single memory die or to more than two memory dies. For example, the first periphery die 312 may further include a third ECC engine and a third core interface to enable substantially concurrent memory accesses and operations at three memory dies. Although the memory dies 304, 306, 308, and 310 are each described as having a flash memory core, in other embodiments one or more of the memory dies 304, 306, 308, and 310 may include multiple flash memory cores or may include one or more cores of another memory type, such as cores of a three-dimensional (3D) memory. Illustrative examples of flash memory and 3D memory are described in FIG. 8.

Figure 4:
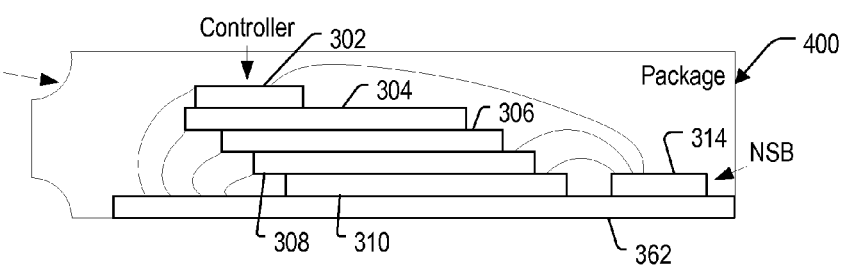
FIG. 4 is a general diagram illustrating a particular embodiment of a package that includes the arrangement of dies of FIG. 3.

FIG. 4 depicts the apparatus 300 of FIG. 3 in a representative package configuration (e.g. a system-in-package (SiP) configuration). The controller die 302, the first memory die 304, the second memory die 306, the third memory die 308, and the fourth memory die 310 are illustrated in a stacked arrangement on a substrate, such as a printed circuit board 362. The periphery die 314 is also coupled to the printed circuit board 362. In addition, the controller die 302, the first memory die 304, the second memory die 306, the third memory die 308, and the fourth memory die 310 are each illustrated as being electrically coupled to the printed circuit board 362 via wire bonds (or via direct electrical coupling (e.g. surface mounting) in the case of the fourth memory die 310). The printed circuit board 362 is coupled to the physical interface 360. For example, the physical interface 360 may include a universal serial bus (USB) physical interface, a secure digital (SD) interface, one or more other physical interfaces to enable communication with a host device, such as with the representative host device 130 FIG. 1, or any combination thereof The package 400 is a common package (i.e. the single package 400 includes each of the dies 302-314) that further includes the printed circuit board 362 and the physical interface 360. In other embodiments, the dies 302-314 may be included in a single package according to other configurations. For example, in other implementations, the package 400 may not include the printed circuit board 362. As another example, the physical interface 360 may be implemented as electrical contacts such as pads or conductive bumps on one or more of the dies 302-314 that are accessible at an exterior of the package 400.

Figure 5:
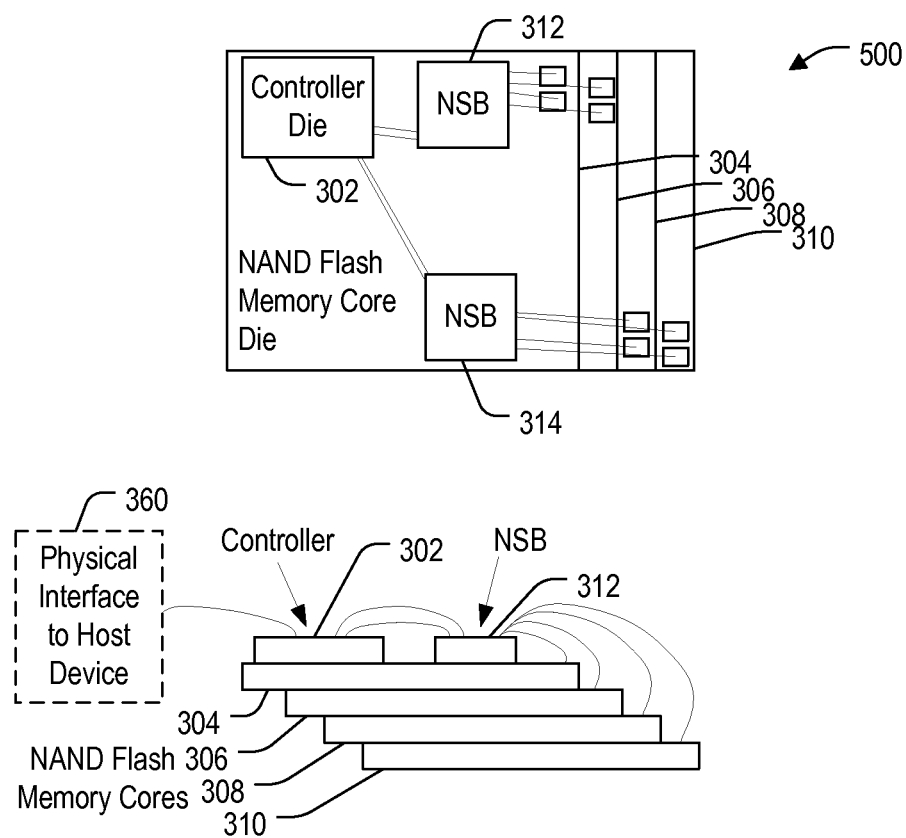
FIG. 5 is a general diagram illustrating a top view and a side elevational view of another particular embodiment of an arrangement of dies that may be included in the data storage device of FIG. 1.

FIG. 5 depicts an apparatus 500 that includes components of the apparatus 300 at FIG. 3 in a different physical configuration. The apparatus 500 includes the controller die 302, the first periphery die 312, the second periphery die 314, the first memory die 304, the second memory die 306, the third memory die 308, and the fourth memory die 310 in a stacked arrangement that is illustrated in a top view and a side elevational view. The first periphery die 312 and the second periphery die 314 are illustrated as stacked on top of the first memory die 304. The first periphery die 312 and the second periphery die 314 may be provided with a faster and/or more reliable communication with the controller die 302 as compared to the configuration of FIG. 3 as a result of shortened lengths of wire bonds between the controller die 302 and the periphery dies 312, 314. The controller die 302 may be coupled to a physical interface 360 to a host device. The apparatus 500 of FIG. 5 may be incorporated into a single package, such as the illustrative package 400 of FIG. 4.

Figure 6:
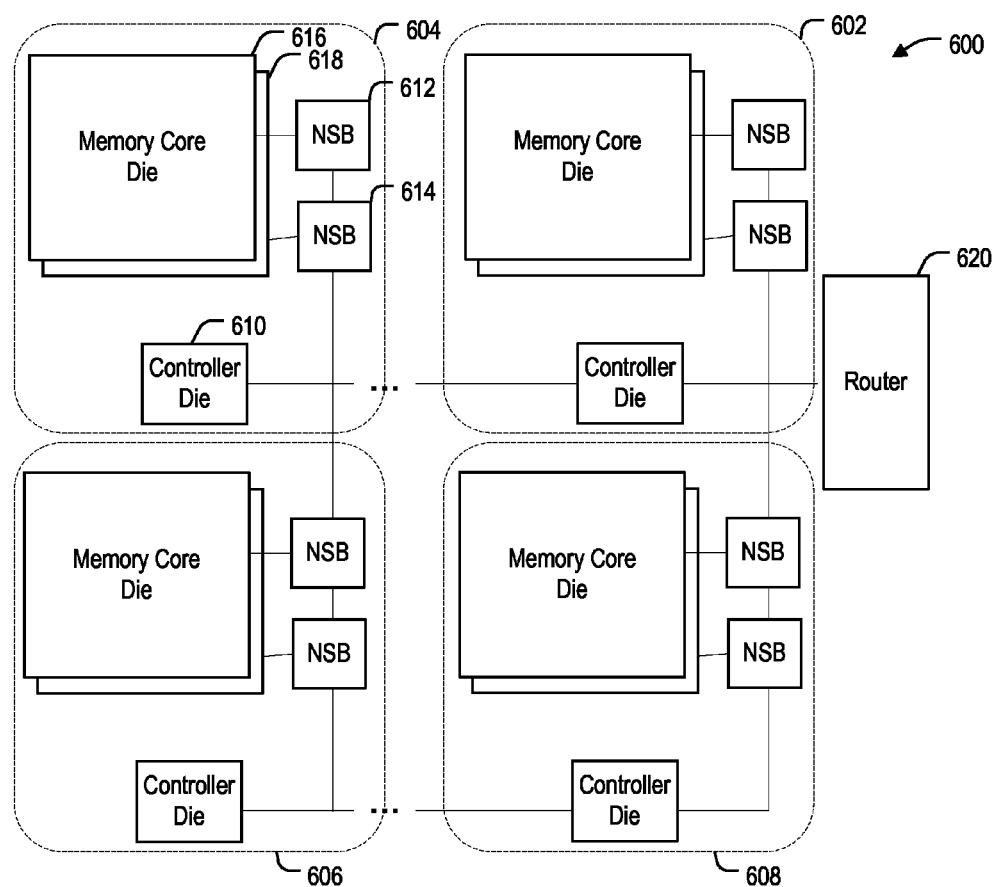
FIG. 6 is a block diagram of a system that includes periphery dies coupled to memory core dies and coupled to controller dies.

Referring to FIG. 6, a particular embodiment of a system 600 including memory cores and periphery circuitry of the memory cores on separate dies (e.g. NAND smart bridge devices) is shown. The system 600 includes a router device 620 coupled to a network of memory subsystems 602, 604, 606, and 608. Each of the memory subsystems 602-608, such as the representative memory subsystem 604, includes a controller die 610, a first NAND smart bridge device 612, a second NAND smart bridge device 614, a first memory core die 616, and a second memory core die 618. The router device 620 may be configured to route messages, such as control signals and/or data, to one or more controller dies, such as the representative controller die 610, for distributed processing among multiple controller dies of the system 600 and for additional distributed processing among the multiple NAND smart bridge devices of the system 600.

For example, the controller die 610 may be configured to receive control information and/or data from the router device 620 and to determine whether or not the controller die 610 is an intended recipient of the control information and/or data. The controller die 610 may be configured to pass along the received control information and/or data to one or more other controller dies or other memory subsystems. When the controller die 610 is determined to be an intended recipient of the control information and/or data, the controller die 610 may be configured to send control instructions to one or both of the NAND smart bridge devices 612, 614 to initiate memory operations at one or both of the memory core dies 616 and 618.

To illustrate, the controller die 610 may be configured to initiate a storage operation of a received data word by sending a first portion of the data word to the first NAND smart bridge device 612 and a second portion of the data word to the second NAND smart bridge device 614, such as described with respect to FIG. 3. The NAND smart bridge devices 612, 614 may be configured to concurrently initiate ECC encoding operations of the first portion of the data word and the second portion of the data word. The NAND smart bridge device 612 may be configured to store an encoded result of a first ECC encode operation to the first memory core die 616 concurrently with the second NAND smart bridge device 614 storing an encoded result of a second ECC operation to the second memory core die 618.

The controller die 610 may be configured to identify itself as an intended recipient of a memory read operation and to recover a data word that was previously stored to the memory cores dies 616, 618. The controller die 610 may be configured to send read instructions to the NAND smart bridge devices 612, 614 to read data corresponding to a first portion of a requested data word and a second portion of the requested data word from the first memory core die 616 and the second memory core die 618, respectively. The controller die 610 may be configured to receive decoded retrieved information from the first NAND smart bridge device 612 and the second NAND smart bridge device 614, to combine the received portions, to perform a second ECC decode operation, such as described with respect to FIG. 3, and to return a result to a requestor via the router device 620. Each of the memory subsystems 602, 606, and 608 may operate as described for the representative subsystem 604.

By enabling multiple parallel memory access operations using a distributed architecture including the controller die 610 and the NAND smart bridge devices 612, 614, the system 600 enables a high data throughput as observed by the router 620. The system 600 may also enable design flexibility by addition or removal of one or more of the memory subsystems 602-608.

Figure 7:
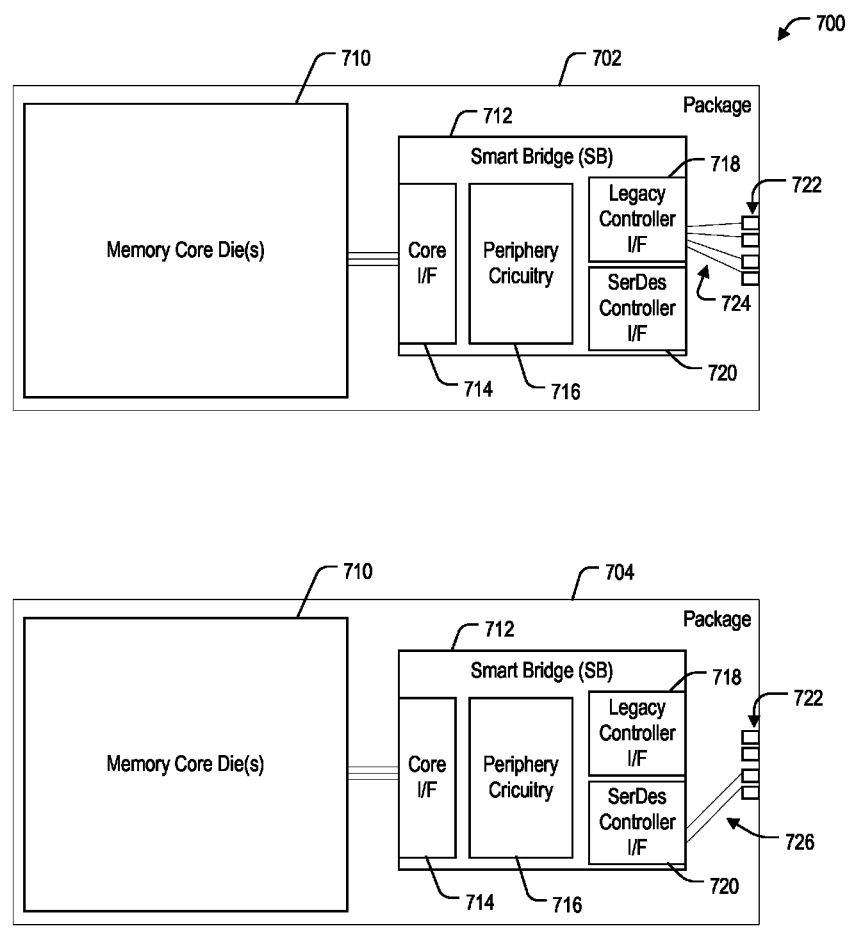
FIG. 7 is a block diagram of two embodiments of a package that each include a smart bridge device that includes multiple host interfaces and periphery circuitry for one or more memory cores.

Referring to FIG. 7, a packaged device 700 including a smart bridge device 712 is illustrated in a first configuration 702 to use a first memory controller interface 718 and a second configuration 704 to use a second memory controller interface 720. The packaged device 700 includes one or more memory core dies 710 coupled to the smart bridge device 712. The smart bridge device 712 includes a core interface 714, peripheral circuitry 716, the first memory controller interface 718, and the second memory controller interface 720. As an example, each of the one or more memory dies 710 may correspond to the memory die 104 of FIG. 2, the core interface 714 may correspond to the core interface 210 of FIG. 2, and the periphery circuitry 716 may correspond to the periphery circuitry 112 illustrated in FIG. 2.

The one or more memory dies 710 and the smart bridge device 712 are housed in a package that has a controller physical interface 722, illustrated as a set of conductive contacts or pins. In the first configuration 702, the first memory controller interface 718 is coupled to the controller physical interface 722 via conductive lines 724, such as wire bonds. The first memory controller interface 718 may be a conventional or "legacy" controller interface that enables an external memory controller to communicate with the packaged device 700 as if the packaged device 700 were a conventional NAND flash memory die. In the second configuration 704, the second memory controller interface 720 is a serializer/deserializer interface that is coupled to the controller physical interface 722 via conductive lines 726. The second configuration 704 enables the packaged device 700 to communicate with a memory controller via a high-speed serial interface.

The first implementation 702 or the second implementation 704 may be selected to enable communication with a particular memory controller device. Although FIG. 7 illustrates that only one of the memory controller interfaces 718, 720 is coupled to the physical interface 722 via conductive lines 724 or 726, in other embodiments the packaged device 700 may include a switching mechanism that can be configured to enable either of the memory controller interfaces 718, 720 to be operatively coupled to the physical interface 722 based on a capability of a memory controller that is to be coupled to the packaged device 700.

Figure 8:
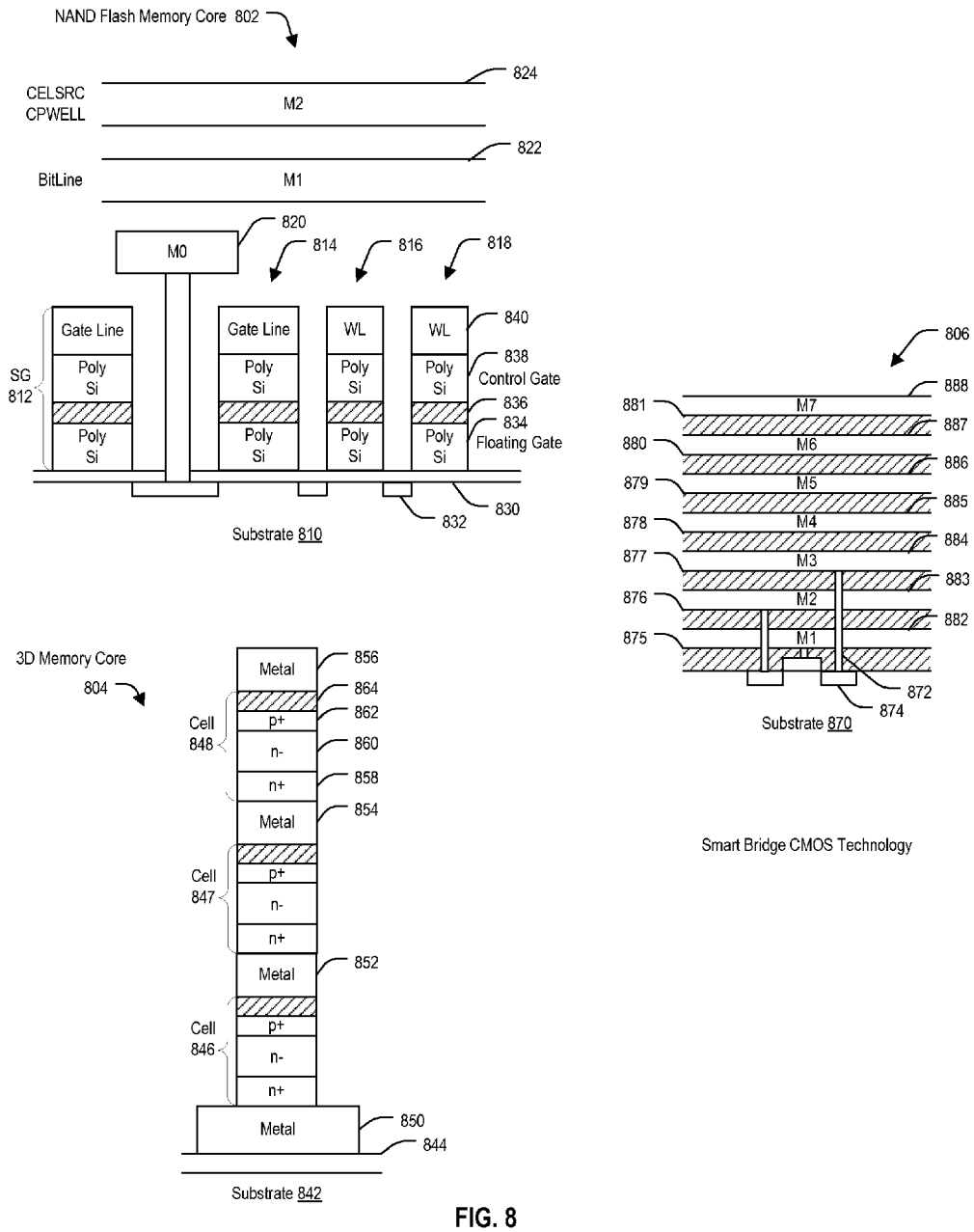
FIG. 8 is a general diagram illustrating embodiments of devices fabricated using NAND flash memory core technology, using three dimensional (3D) memory core technology, and a smart bridge CMOS technology.

Referring to FIG. 8, a particular illustrative embodiment of a first layout for a NAND flash memory core 802 is depicted. A second layout for a 3D memory core 804 and a third layout for a smart bridge device 806 including a multi-metallization layer interconnect for complementary metal-oxide-semiconductor (CMOS) are also depicted. The NAND flash memory core 802, the 3D memory core 804, and the smart bridge device 806 are depicted in a simplified format for ease of explanation and are not necessarily drawn to scale.

The NAND flash memory core 802 includes a substrate 810 and structures including a first source gate (SG) 812, a second source gate 814, a first NAND flash memory cell 816, and a second NAND flash memory cell 818. The NAND flash memory core 802 has a first metallization layer (M0) 820, a second metallization layer (M1) 822, and a third metallization layer (M2) 824. The structures 812-818 and the metallization layers 820-824 are separated by dielectric material(s).

The NAND flash memory cells 816 and 818 are representative cells of a NAND flash string that is selectively isolated from or coupled to a source line via the second source gate 814. Although only two cells 816, 818 are illustrated, the NAND flash string may have any number of cells, such as 64 cells. Each of the cells 816 and 818 includes a conductive floating gate (e.g. a polysilicon gate) 834 that is isolated from the substrate 810 via a tunnel insulator (e.g. a tunnel oxide) 830. An insulator layer 836 is disposed above the floating gate 834, and a control gate (e.g. a polysilicon gate) 838 is disposed above the insulator layer 836. A conductive word line (WL) 840 (e.g. a metal line) is positioned on the control gate 838. The source gates 812, 814 have a similar structure as the cells 816, 818. Highly doped regions of the substrate 810, such as a representative doped region 832, are positioned between the structures of the NAND flash string. For example, the doped region 832 may be a portion of the substrate 810 having a high concentration of electron donors (i.e. an n+ region).

The first metallization layer M0 820 includes a source line that is coupled to a source at a first end of the illustrated NAND flash string via a representative interconnection or a via that provides an electrical connection between the M0 layer 820 and a source region of the substrate 810. The second metallization layer M1 822 includes a bit line that is coupled to a second end of the NAND flash string via a drain gate (not shown). The third metallization layer M2 824 includes cell source lines (CELSRC) and p-well lines (CPWELL).

The NAND flash memory core 802 may be designed to satisfy criteria such as a height limit of a package that includes the NAND flash memory core 802. For example, a memory density may be increased by stacking multiple memory core dies in a package. Because a thickness of each memory core die increases with each additional metallization layer 820-824 that is included in the memory core, a higher memory density may be obtained in a package of multiple NAND flash memory cores by using as few metallization layers as possible in each NAND flash memory core. A cost to manufacture the NAND flash memory core may increase with each additional metallization layer that is used. Using fewer metallization layers may therefore reduce a manufacturing cost associated with the NAND flash memory core.

The 3D memory core 804 includes a substrate 842, an insulating layer 844 on the substrate 842, and memory cells 846, 847, and 848 stacked above the substrate 842 in a representative vertical column of 3D memory. The first memory cell 846 is located between a first metal layer 850 and a second metal layer 852, the second memory cell 847 is located between the second metal layer 852 and a third metal layer 854, and the third memory cell 848 is located between the third metal layer 854 and a fourth metal layer 856. Each cell 846-848 has a diode-type structure that includes a first layer 858 with a high concentration of electron donors (n+ layer), a second layer 860 with a lower concentration of electron donors (n− layer), a third layer 862 with a high concentration of hole donors (p+ layer), and a control layer 864 that is configurable to function as an isolation layer or a conductive layer. For example, a first data value may be stored in the third memory cell 848 by the control layer 864 being configured to have an electrically conductive characteristic that allows current to flow between the third metal layer 854 and the fourth metal layer 856. A second data value may be stored in the third memory cell 848 by the control layer 864 being configured to have an electrically insulating characteristic to prevent or significantly reduce current flow between the third metal layer 854 and the fourth metal layer 856.

The 3D memory core 804 may be designed with an increased storage capacity by increasing a number of memory cells in each vertical column. However, increasing the number of cells in each column increases the height of the column, resulting in stacks of metal and semiconductor that may have increased height (i.e. a larger distance from the substrate 842) as compared to logic that uses relatively shallow structures (i.e. at a smaller distance from the substrate 842). Combining 3D memory cells and logic on a single die can present design challenges due to the disparity in height between the memory cell structures and the shallow logic structures (e.g. transistors).

The smart bridge device 806 includes multiple metallization layers 882-888 separated by dielectric layers 875-881 over a substrate 870. A logic structure is illustrated as a transistor having a source 874 formed of a doped region of the substrate 870. A via 872 is illustrated that provides a conductive path between the source 874 and the third metallization layer (M3) 884. The transistor also includes a drain that is coupled to the second metallization layer (M2) 883 and a gate that is coupled to the first metallization layer (M1) 882.

The multiple metallization layers 882-888 enable an increased density of logic structures (e.g. transistors) to be formed on the substrate 870 as compared to the NAND flash memory core 802 because each additional metallization layer increases a number of available lines to route signals between logic structures. For example, design criteria regarding metal line thickness and spacing between adjacent lines may constrain placement of vias and may also limit a number of available signaling paths for logic structures formed on the NAND flash memory core 802. Because only three metallization layers 820-822 are available on the NAND flash memory core 802, placement of interconnects for signal routing may be more distributed (i.e. fewer interconnects and fewer signals can be provided per unit area) than on the smart bridge device 806. As a result, dimensions of logic structures on the NAND flash memory core 802 may be larger than on the smart bridge device 806.

Various benefits may be attained by implementing periphery circuitry that is conventionally located at a NAND flash memory core at the smart bridge device 806. For example, because smaller devices typically use less power than larger devices, power consumption may be reduced. As another example, because larger devices spread out over a larger area require larger drivers for high-speed operation, improvement in operating speed, reduction in driver size and driver power consumption, or both, may be attained.

As another example, structures that require a large number of signal paths (e.g. dual-ported SRAM) that may be difficult to implement in the NAND flash memory core 802 may be relatively simple to implement using the multiple metallization layers of the smart bridge device 806.

Dual-ported SRAM can be used as a cache to improve a throughput of memory operations. For example, dual-ported SRAM can enable the smart bridge device 806 to hold data that is received from a memory controller during a write operation until the NAND flash memory core 802 is ready to store the received data. As other examples, SRAM can be used at the smart bridge device 806 for processing and analysis of data, such as reading multiple word lines for analysis (e.g. for interference, program disturb, and/or read disturb), multiple read results of a word line with different read voltages to enable error correction, analysis of data to be stored (for specific data patterns), and to enable scrambling of data that is to be stored, as illustrative, non-limiting examples.

As another example, implementing periphery circuitry that is conventionally located at a NAND flash memory core at the smart bridge device 806 frees space on the NAND flash memory core 802 and enables an increase of storage capacity by adding additional memory elements. Implementing periphery circuitry at the smart bridge device 806 enables a size of the NAND flash memory core 802 to be reduced as compared to conventional flash memory cores with substantially similar storage capacity. Implementing periphery circuitry at the smart bridge device 806 also enables a pitch (e.g. cell-to-cell spacing) of the NAND flash memory core 802 to be increased as compared to conventional NAND flash memory cores. By increasing a cell-to-cell spacing within the NAND flash memory core 802 as compared to conventional NAND flash memory cores, cross-coupling effects, program disturb effects, read disturb effects, and/or other effects that may cause data errors may be reduced in the NAND flash memory core 802 as compared to conventional NAND flash memory cores. As a result of fewer errors occurring in the NAND flash memory core 802 as compared to conventional NAND flash memory cores, a simpler ECC engine may be used (with reduced size, cost, and/or power consumption), an increased device lifetime may be attained, or both.

Another example of periphery circuitry that can be implemented at the smart bridge device 806 is a charge pump of the NAND flash memory core 802. Due to the relatively large size of charge pumps, a conventional NAND flash memory core has relatively few charge pumps and uses relatively long NAND strings (e.g. 64 cells/string) between a bit line and a source line. A greater number of charge pumps providing a greater amount charge may be integrated in the smart bridge device 806 than are available in a conventional NAND flash memory core. As a result, shorter NAND strings (e.g. 32 cells/string) may be used, and read times and program times may be improved as compared to conventional NAND flash memory cores that use fewer charge pumps coupled to longer NAND strings.

Although various benefits are described with respect to the NAND flash memory core 802, similar benefits may be attained in a 3D memory device by moving periphery circuitry of the 3D memory core 804 to the smart bridge device 806. Similar benefits may be attained in the system 100 of FIGS. 1-2, the apparatus 300 of FIG. 3, the package 400 of FIG. 4, the apparatus 500 of FIG. 5, the system 600 of FIG. 6, the packaged device 700 of FIG. 7, or any combination thereof.

Figure 9:
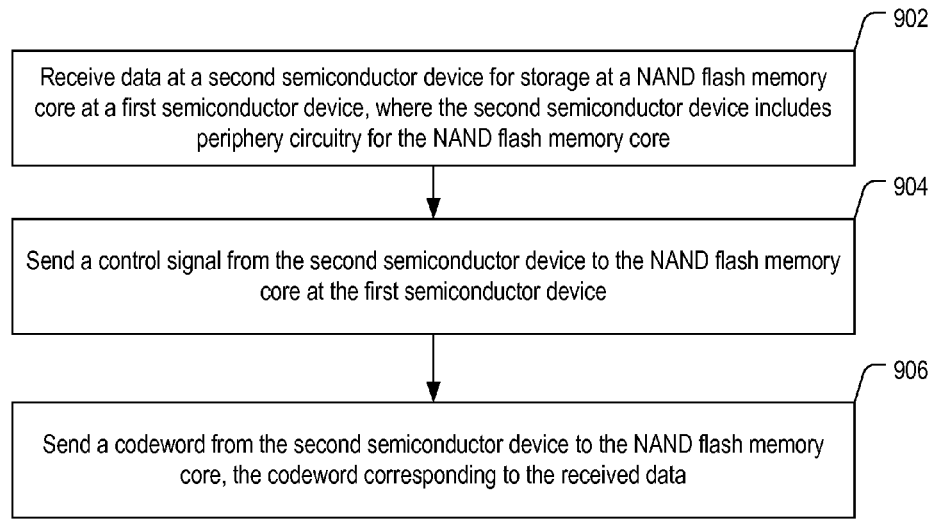
FIG. 9 is a flow chart of a first embodiment of a method that may be performed at a smart bridge device.

FIG. 9 is a flowchart of a particular embodiment of a method of operating a device, such as the second semiconductor device 108 of FIGS. 1-2, the periphery die 312 or 314 of FIGS. 3-5, the NAND smart bridge device 612 or 614 of FIG. 6, or the smart bridge 712 of FIG. 7, as illustrative, non-limiting examples. Data is received at a second semiconductor device for storage at a NAND flash memory core at a first semiconductor device, at 902. For example, the first semiconductor device may be the first semiconductor device 104 of FIG. 1 and the second semiconductor device may be the second semiconductor device 108 of FIG. 1. As another example, the first semiconductor device may be the first memory die 304 or the second memory die 306 of FIGS. 3-5 and the second semiconductor device may be the first periphery die 312 of FIGS. 3-5. As another example, the first semiconductor device may be the third memory die 308 or the fourth memory die 310 of FIGS. 3-5 and the second semiconductor device may be the second periphery die 314 of FIGS. 3-5. As another example, the first semiconductor device may be the first memory core die 616 of FIG. 6 and the second semiconductor device may be the first NAND smart bridge device 612 of FIG. 6. As another example, the first semiconductor device may be the second memory core die 618 of FIG. 6 and the second semiconductor device may be the second NAND smart bridge device 614 of FIG. 6. As another example, the first semiconductor device may be the memory core die 710 of FIG. 7 and the second semiconductor device may be the smart bridge device 712 of FIG. 7. The data may be received from a memory controller coupled to the second semiconductor device, such as the controller 106 of FIG. 1.

The second semiconductor device includes periphery circuitry for the NAND flash memory core. For example, the periphery circuitry may include at least one of a processor, an error correction coding (ECC) engine, a row decoder, a charge pump, and a multi-ported static random access memory (SRAM). To illustrate, the periphery circuitry may correspond to the periphery circuitry 112 illustrated in FIG. 1 or in FIG. 2, may include the first ECC engine 344 or the second ECC engine 346 of FIG. 3, or may correspond to the periphery circuitry 716 of FIG. 7, as illustrative, non-limiting examples.

A control signal is sent from the second semiconductor device to the NAND flash memory core at the first semiconductor device, at 904. For example, the control signal may be the control signal 150 of FIG. 1. The control signal may instruct the NAND flash memory core to initiate a data storage operation.

A codeword may be sent from the second semiconductor device to the NAND flash memory core, at 906. The codeword can correspond to the received data. For example, the codeword can be an output of an ECC operation that is performed at the second semiconductor device. The NAND flash memory core may be responsive to the control signal to store the codeword.

Figure 10:
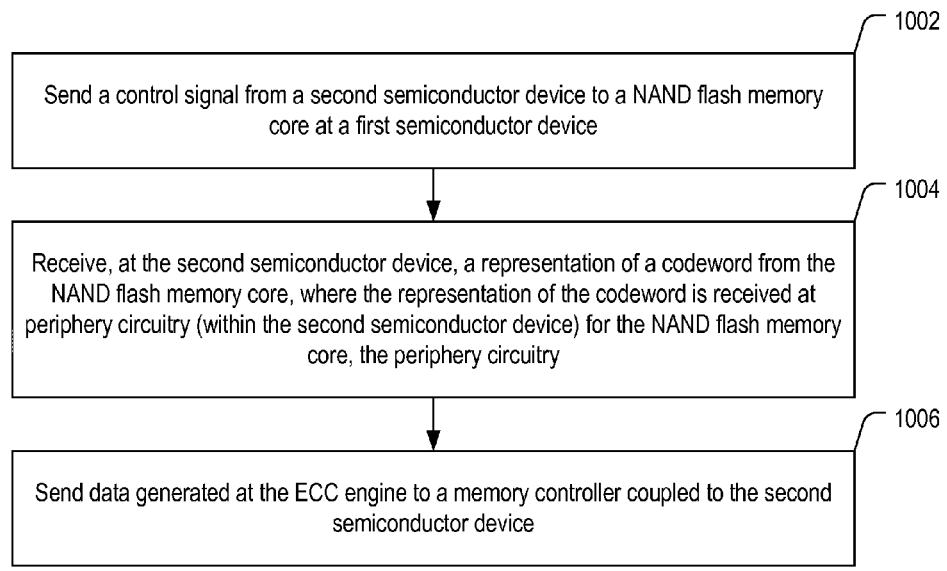
FIG. 10 is a flow chart of a second embodiment of a method that may be performed at a smart bridge device.

FIG. 10 is a flowchart of a particular embodiment of a method of operating a device, such as the second semiconductor device 108 of FIGS. 1-2, the periphery die 312 or 314 of FIGS. 3-5, the NAND smart bridge device 612 or 614 of FIG. 6, or the smart bridge 712 of FIG. 7, as illustrative, non-limiting examples. A control signal is sent from a second semiconductor device to a NAND flash memory core at a first semiconductor device, at 1002. For example, the control signal may be the control signal 150 of FIG. 1. As another example, the first semiconductor device may be the first memory die 304 or the second memory die 306 of FIGS. 3-5 and the second semiconductor device may be the first periphery die 312 of FIGS. 3-5. As another example, the first semiconductor device may be the third memory die 308 or the fourth memory die 310 of FIGS. 3-5 and the second semiconductor device may be the second periphery die 314 of FIGS. 3-5. As another example, the first semiconductor device may be the first memory core die 616 of FIG. 6 and the second semiconductor device may be the first NAND smart bridge device 612 of FIG. 6. As another example, the first semiconductor device may be the second memory core die 618 of FIG. 6 and the second semiconductor device may be the second NAND smart bridge device 614 of FIG. 6. As another example, the first semiconductor device may be the memory core die 710 of FIG. 7 and the second semiconductor device may be the smart bridge device 712 of FIG. 7.

The method also includes receiving, at the second semiconductor device, a representation of a codeword from the NAND flash memory core, at 1004. For example, the representation of the codeword may be retrieved from the memory core 120 of FIG. 1 and may include one or more bit errors.

The representation of the codeword is received at periphery circuitry for the NAND flash memory core. The periphery circuitry may include at least one of a processor, an error correction coding (ECC) engine, a row decoder, a charge pump, and a multi-ported static random access memory (SRAM). For example, the periphery circuitry may be the periphery circuitry 112 illustrated in FIG. 1 or in FIG. 2, may include the first ECC engine 344 or the second ECC engine 346 of FIG. 3, or may correspond to the periphery circuitry 716 of FIG. 7, as illustrative, non-limiting examples.

Data generated at the ECC engine may be sent to a memory controller coupled to the second semiconductor device, at 1006. For example, the periphery circuitry may include the error correction coding (ECC) engine 228 of FIG. 2. A decode operation of the representation of the codeword may be initiated at the ECC engine 228 to recover decoded data and the decoded data may be sent to the controller 106 of FIG. 2. As another example, the memory controller may be the controller 106 of FIG. 1 or may be implemented at the controller die 302 of FIGS. 3-5 or at the controller die 610 of FIG. 6 as illustrative, non-limiting examples.

Figure 11:
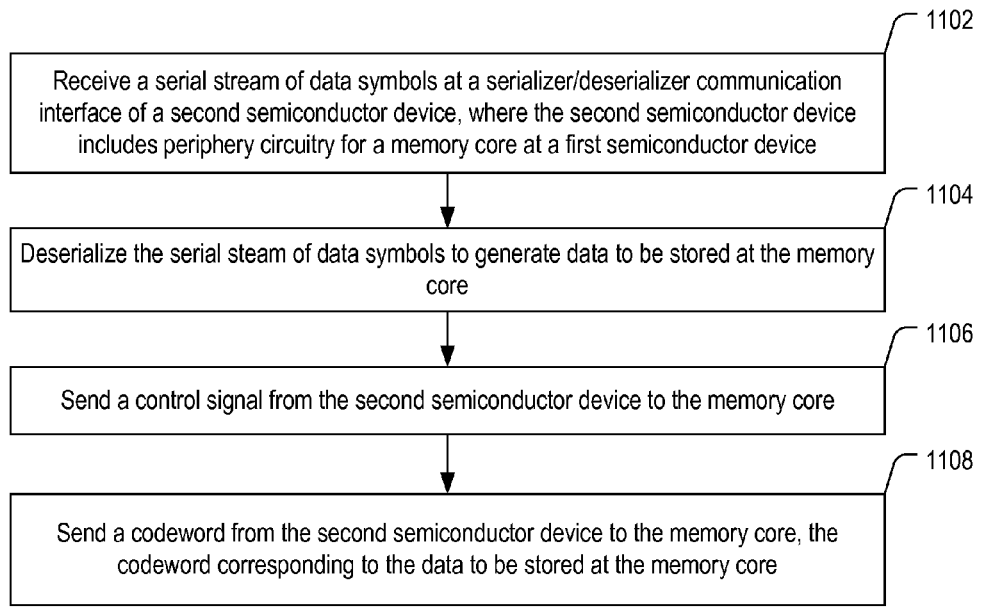
FIG. 11 is a flow chart of a third embodiment of a method that may be performed at a smart bridge device.

FIG. 11 is a flowchart of a particular embodiment of a method of operating a device, such as the second semiconductor device 108 of FIGS. 1-2, the periphery die 312 or 314 of FIGS. 3-5, the NAND smart bridge device 612 or 614 of FIG. 6, or the smart bridge 712 of FIG. 7, as illustrative, non-limiting examples. A serial stream of data symbols are received at a serializer/deserializer communication interface of a second semiconductor device, at 1102. The second semiconductor device includes periphery circuitry for a memory core at a first semiconductor device. The periphery circuitry may include at least one of a processor, an error correction coding (ECC) engine, a row decoder, a charge pump, and a multi-ported static random access memory (SRAM). For example, the second semiconductor device may be the second semiconductor device 108 illustrated in FIG. 2. As another example, the first semiconductor device may be the first memory die 304 or the second memory die 306 of FIGS. 3-5 and the second semiconductor device may be the first periphery die 312 of FIGS. 3-5. As another example, the first semiconductor device may be the third memory die 308 or the fourth memory die 310 of FIGS. 3-5 and the second semiconductor device may be the second periphery die 314 of FIGS. 3-5. As another example, the first semiconductor device may be the first memory core die 616 of FIG. 6 and the second semiconductor device may be the first NAND smart bridge device 612 of FIG. 6. As another example, the first semiconductor device may be the second memory core die 618 of FIG. 6 and the second semiconductor device may be the second NAND smart bridge device 614 of FIG. 6. As another example, the first semiconductor device may be the memory core die 710 of FIG. 7 and the second semiconductor device may be the smart bridge device 712 of FIG. 7.

The serial steam of data symbols is deserialized to generate data to be stored at the memory core, at 1104. The serial stream of data symbols may be received from a memory controller coupled to the second semiconductor device via a second serializer/deserializer communication interface. For example, the serial stream of data symbols may be the stream of data symbols 216 of FIG. 2.

A control signal is sent from the second semiconductor device to the memory core, at 1106. For example, the control signal be the control signal 150 of FIG. 1. The memory core may be responsive to the control signal to initiate a data store operation.

A codeword may be sent from the second semiconductor device to the memory core, at 1108. The codeword may correspond to the data to be stored at the memory core. For example, the codeword may be generated at an ECC engine within the periphery circuitry. The memory core may be responsive to the control signal to store the codeword.

Figure 12:
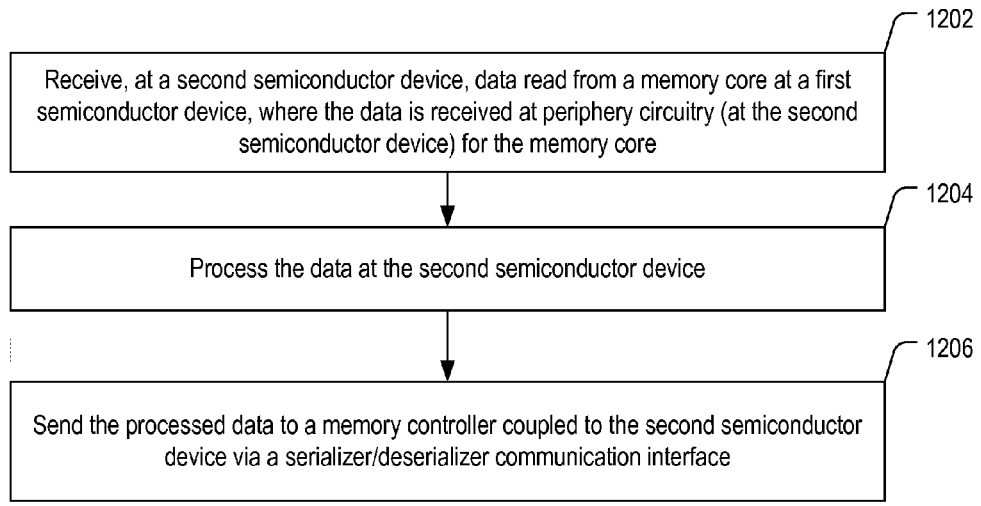
FIG. 12 is a flow chart of a fourth embodiment of a method that may be performed at a smart bridge device.

FIG. 12 is a flowchart of a particular embodiment of a method that may be performed at the second semiconductor device 108 of FIGS. 1-2, the periphery die 312 or 314 of FIGS. 3-5, the NAND smart bridge device 612 or 614 of FIG. 6, or the smart bridge 712 of FIG. 7, as illustrative, non-limiting examples. The method includes receiving, at a second semiconductor device, data read from a memory core at a first semiconductor device, at 1202. The data is received at periphery circuitry for the memory core. The periphery circuitry is at the second semiconductor device, such as the periphery circuitry 112 of FIGS. 1-2, and may include at least one of a processor, an error correction coding (ECC) engine, a row decoder, a charge pump, and a multi-ported static random access memory (SRAM). For example, the first semiconductor device may be the first semiconductor device 104 of FIGS. 1-2 and the second semiconductor device may be the second semiconductor device 108 of FIGS. 1-2. As another example, the first semiconductor device may be the first memory die 304 or the second memory die 306 of FIGS. 3-5 and the second semiconductor device may be the first periphery die 312 of FIGS. 3-5. As another example, the first semiconductor device may be the third memory die 308 or the fourth memory die 310 of FIGS. 3-5 and the second semiconductor device may be the second periphery die 314 of FIGS. 3-5. As another example, the first semiconductor device may be the first memory core die 616 of FIG. 6 and the second semiconductor device may be the first NAND smart bridge device 612 of FIG. 6. As another example, the first semiconductor device may be the second memory core die 618 of FIG. 6 and the second semiconductor device may be the second NAND smart bridge device 614 of FIG. 6. As another example, the first semiconductor device may be the memory core die 710 of FIG. 7 and the second semiconductor device may be the smart bridge device 712 of FIG. 7.

The data is processed at the second semiconductor device, at 1204. For example, the received data includes a representation of a codeword (e.g. the received data may include a codeword that has one or more bit errors. The periphery circuitry may include an error correction coding (ECC) engine, such as the ECC engine 228 of FIG. 2, the first ECC engine 344 of FIG. 3, or the second ECC engine 346 of FIG. 3, as illustrative, non-limiting examples. Processing the data at the second semiconductor device may include initiating a decode operation of the representation of the codeword at the ECC engine.

The processed data is sent to a memory controller coupled to the second semiconductor device via a serializer/deserializer communication interface, at 1206. For example, the processed data may be sent as the stream of data symbols 216 from the controller interface 214 to the memory interface 240 of FIG. 2. As another example, the memory controller may be the controller 106 of FIG. 1 or may be implemented at the controller die 302 of FIGS. 3-5 or at the controller die 610 of FIG. 6 as illustrative, non-limiting examples.

Figure 13:
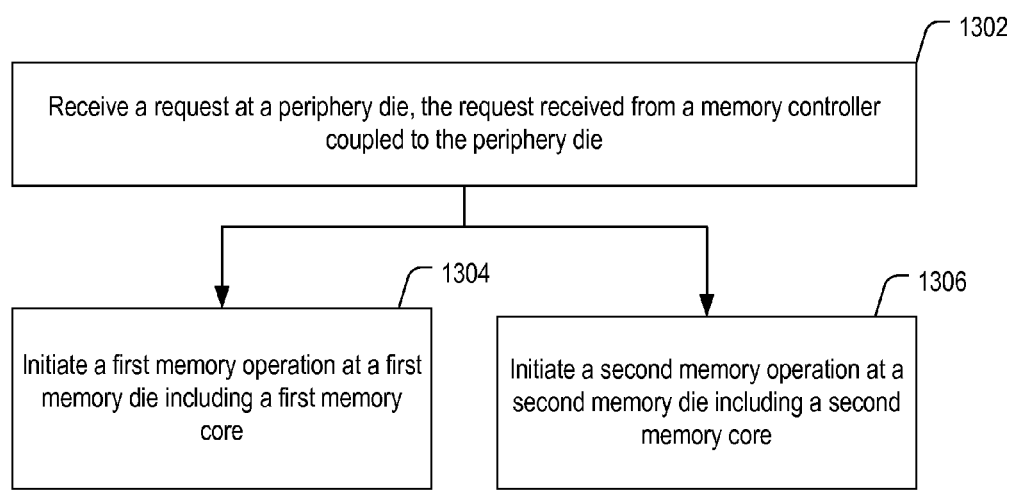
FIG. 13 is a flow chart of a fifth embodiment of a method that may be performed at a smart bridge device.

FIG. 13 is a flowchart of a particular embodiment of a method that may be performed at the second semiconductor device 108 of FIGS. 1-2, the periphery die 312 or 314 of FIGS. 3-5, the NAND smart bridge device 612 or 614 of FIG. 6, or the smart bridge 712 of FIG. 7, as illustrative, non-limiting examples. A request is received at a periphery die, at 1302. The request is received from a memory controller coupled to the periphery die. For example, the memory controller may be the controller 106 and the periphery die may be the second semiconductor device 108 of FIGS. 1-2. As another example, the controller may be implemented in the controller die 302 of FIGS. 3-5 and the periphery die may be the first periphery die 312 or the second periphery die 314 of FIGS. 3-5. As another example, the memory controller may be implemented at the controller die 610 of FIG. 6 and the periphery die may be the first NAND smart bridge device 612 or the second NAND smart bridge device 614 of FIG. 6. As another example, the periphery die may be the smart bridge device 712 of FIG. 7.

The periphery die includes periphery circuitry corresponding to a first memory core and periphery circuitry corresponding to a second memory core. For example, the periphery die may be the first periphery die 312 of FIG. 3 that includes periphery circuitry for the first memory core at the first memory core die 304 and periphery circuitry for the second memory core at the second memory core die 306.

The method includes, in response to the request, initiating a first memory operation at a first memory die including a first memory core, at 1304, and initiating a second memory operation at a second memory die including a second memory core, at 1306. The periphery die may be configured to perform the first memory operation substantially concurrently with performing the second memory operation. The first memory core and the second memory core may be implemented in the first semiconductor device 104 of FIGS. 1-2, in one or more of the memory core dies 304-310 of FIGS. 3-5, in one or more of the memory core dies 616, 618 of FIG. 6, or in the one or more memory core dies 710 of FIG. 7, as illustrative, non-limiting examples.

As an example, if the request is a request to store data, the first memory operation may include storing a first portion of the data to the first memory core and the second memory operation may include storing a second portion of the data to the second memory core. As another example, if the request is a request to retrieve stored data, the first memory operation may include reading a first portion of the stored data from the first memory core and the second memory operation may includes reading a second portion of the stored data from the second memory core. As a third example, if the request is a request to erase stored data, the first memory operation may include erasing data at the first memory core and the second memory operation may include erasing data at the second memory core.

As another example, the first memory operation and the second memory operation may be different types of memory operations. To illustrate, the first memory operation may include a write operation of first data and the second memory operation may include a read operation of second data. The write operation may be performed substantially concurrently with performing the read operation.

The periphery die may include a first error correction coding (ECC) engine and a second ECC engine, such as the first ECC engine 344 and the second ECC engine 346 of FIG. 3. A first ECC operation may be performed at the first ECC engine substantially concurrently with a second ECC operation being performed at the second ECC engine. For example, the first ECC operation may include encoding first data at the first ECC engine and the second ECC operation may include encoding second data at the second ECC engine. The first data may be a first portion of received data from the memory controller and the second data may be a second portion of the received data from the memory controller. The first memory operation may include storing a first codeword generated by the first ECC operation to the first memory core. The second memory operation may include storing a second codeword generated by the second ECC operation to the second memory core.

As another example, the first ECC operation may include decoding first data at the first ECC engine and the second ECC operation may include decoding second data at the second ECC engine. The first data may correspond to a first portion of data requested by the memory controller and the second data may correspond to a second portion of the data requested by the memory controller. The first memory operation may include retrieving a first representation of a first codeword from the first memory core to be decoded by the first ECC operation. The second memory operation may include retrieving a second representation of a second codeword from the second memory core to be decoded by the second ECC operation.

Although various components depicted herein are illustrated as block components and described in general terms, such components may include one or more microprocessors, state machines, or other circuits configured to enable the smart bridge device 108 to perform the particular functions attributed to such components. For example, the periphery circuitry 112 may represent physical components, such as hardware controllers, state machines, logic circuits, or other structures, to enable the smart bridge device 108 to conduct memory operations at the memory core 120 of FIG. 1.

The smart bridge device 108 may include dedicated hardware (i.e. circuitry) to implement communication with one or more memory controllers and to initiate operations at one or more memory cores. Alternatively, or in addition, the smart bridge device 108 may implement communication with one or more memory controllers and initiate operations at one or more memory cores using a microprocessor or microcontroller. In a particular embodiment, the smart bridge device 108 includes instructions that are executed by the processor 212 of FIG. 2 and the instructions are stored at the memory core 120. Alternatively, or in addition, instructions that are executed by a processor that may be included in the smart bridge device 108 may be stored at a separate memory location that is not part of the memory core 120, such as at a read-only memory (ROM).

In a particular embodiment, the smart bridge device 108 may be implemented in a portable device configured to be selectively coupled to one or more external devices. However, in other embodiments, the smart bridge device 108 may be attached or embedded within one or more host devices, such as within a housing of a host portable communication device. For example, the smart bridge device 108 may be within a packaged apparatus such as a wireless telephone, personal digital assistant (PDA), gaming device or console, portable navigation device, or other device that uses internal non-volatile memory. In a particular embodiment, the smart bridge device 108 may be coupled to a non-volatile memory, such as a three-dimensional (3D) memory, flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Accordingly, the disclosure and the figures are to be regarded as illustrative rather than restrictive.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:
1. An apparatus comprising:
   a first semiconductor die including a NAND flash memory core, wherein the NAND flash memory core includes a three-dimensional (3D) memory core that includes multiple memory cells arranged in multiple physical levels monolithically formed above a substrate of the first semiconductor die and that includes circuitry associated with operation of the multiple memory cells;
   a second semiconductor die including:
      periphery circuitry associated with the NAND flash memory core;
      a first memory interface coupled to the 3D memory core; and
      a memory controller interface; and
   a third semiconductor die including:
      a memory controller, the memory controller configured to communicate with a host device via a host interface; and
      a second memory interface coupled to the memory controller interface, wherein the second memory interface is configured to enable communication with the 3D memory core via the second semiconductor die,
   wherein the periphery circuitry includes a row decoder configured to operate as a row decoder of the NAND flash memory core, and wherein the memory controller at the third semiconductor die is further configured to operate as a memory controller of the NAND flash memory core.

2. The apparatus of claim 1, wherein the first semiconductor die does not include a row decoder, and wherein the first semiconductor die and the second semiconductor die do not include a memory controller.

3. The apparatus of claim 1, wherein the second semiconductor die comprises a NAND smart bridge that comprises a NAND management device.

4. The apparatus of claim 1, wherein the row decoder is further configured to decode at least a portion of an address and to select a row of the NAND flash memory core.

5. The apparatus of claim 1, wherein the second semiconductor die further includes multi-ported static random access memory.

6. The apparatus of claim 5, wherein the second semiconductor die further includes circuitry configured to concurrently process multiple word lines of data at the multi-ported static random access memory.

7. The apparatus of claim 6, wherein the circuitry is further configured to:
receive the multiple word lines of data from the 3D memory core; and
process the multiple word lines of data to detect at least one of an interference condition of the 3D memory core, a program disturb condition of the 3D memory core, or a read disturb condition of the 3D memory core.

8. The apparatus of claim 6, wherein the multiple word lines of data are configured to be sensed from a single word line of the NAND flash memory core using different sets of read voltages, and wherein the multi-ported static random access memory is configured to receive the multiple word lines of data from the first semiconductor die.

9. The apparatus of claim 6, wherein the second semiconductor die further includes a first error correction coding (ECC) engine that is configured to perform error correction processing of the multiple word lines of data.

10. The apparatus of claim 9, wherein the first ECC engine is further configured to encode first data to be stored in the 3D memory core, and wherein the second semiconductor die further includes a second ECC engine configured to encode second data concurrently with the first ECC engine encoding the first data.

11. The apparatus of claim 6, wherein the circuitry is further configured to process the multiple word lines of data to detect specific data patterns.

12. The apparatus of claim 6, wherein the circuitry is further configured to process the multiple word lines of data by scrambling data to be stored to the 3D memory core.

13. The apparatus of claim 1, further comprising a fourth semiconductor die including a NAND flash memory, wherein the second semiconductor die further includes a second memory device interface coupled to the NAND flash memory.

14. The apparatus of claim 1, wherein the multiple memory cells and the multiple physical levels are integrated within a single die that includes the substrate, the multiple memory cells including a first memory cell located at a first distance from the substrate and a second memory cell located at a second distance from the substrate, the second distance greater than the first distance.

15. The apparatus of claim 1, wherein the periphery circuitry further includes an error correction coding (ECC) engine.

16. The apparatus of claim 15, wherein the periphery circuitry is configured to process multiple word lines of data to scramble data to be stored to the NAND flash memory core.

17. The apparatus of claim 1, wherein the periphery circuitry further includes multi-ported static random access memory (SRAM).

18. The apparatus of claim 17, wherein the periphery circuitry is configured to concurrently process multiple word lines of data at the multi-ported SRAM.

19. The apparatus of claim 18, wherein the periphery circuitry is further configured to:
receive the multiple word lines of data from the NAND flash memory core; and process the multiple word lines of data to detect at least one of an interference condition, a program disturb condition, or a read disturb condition.

20. The apparatus of claim 18, wherein the multiple word lines of data correspond to a single word line read with different sets of read voltages, and wherein the periphery circuitry is further configured to perform error correction processing of the multiple word lines of data.

21. The apparatus of claim 18, wherein the periphery circuitry is further configured to process the multiple word lines of data to detect specific data patterns.

22. The apparatus of claim 17, wherein the periphery circuitry is further configured to operate the multi-ported SRAM as a cache memory.

23. The apparatus of claim 22, wherein the periphery circuitry further includes control logic, and wherein the control logic comprises at least one of a finite state machine and a micro-programmed engine.

24. The apparatus of claim 1, further comprising a fourth die including a second NAND flash memory core, wherein the periphery circuitry is configured to generate control signals to control operation of the NAND flash memory core and to control operation of the second NAND flash memory core, and wherein the periphery circuitry comprises:
a first error correction coding (ECC) engine configured to encode first data to be stored in the NAND flash memory core; and
a second ECC engine configured to encode second data to be stored in the second NAND flash memory core.

25. The apparatus of claim 1, wherein the periphery circuitry is configured to perform a first error correction coding (ECC) operation, wherein the memory controller is further configured to perform a second ECC operation, and wherein the first ECC operation uses a different error correction code than the second ECC operation.

26. A method of NAND smart bridge operation, the method comprising:
receiving data for storage at a NAND flash memory core at a first semiconductor die, wherein the NAND flash memory core includes a three-dimensional (3D) memory core that includes multiple memory cells arranged in multiple physical levels above a substrate and that includes circuitry associated with operation of the multiple memory cells, wherein the data is received at a second semiconductor die that includes periphery circuitry for the NAND flash memory core, and wherein the data is received from a memory controller that is on a third semiconductor die, the third semiconductor die coupled to the second semiconductor die; and
sending a control signal from the second semiconductor die to the NAND flash memory core of the first semiconductor die, wherein the periphery circuitry generates the control signal to affect operation of the NAND flash memory in response to receiving one or more commands from the memory controller on the third semiconductor die.

27. The method of claim 26, wherein the first semiconductor die lacks circuitry to generate the control signal and wherein the first semiconductor die and the second semiconductor die do not include a memory controller.

28. The method of claim 26, wherein the periphery circuitry includes at least one of a processor, an error correction coding (ECC) engine, a row decoder, a charge pump, and a multi-ported static random access memory (SRAM).

29. The method of claim 26, further comprising sending a codeword from the second semiconductor die to the NAND flash memory core, the codeword corresponding to the received data, wherein the NAND flash memory core is responsive to the control signal to store the codeword.

30. A method of NAND smart bridge operation, the method comprising:
sending a control signal to a NAND flash memory core at a first semiconductor die, the control signal sent from a second semiconductor die, wherein the NAND flash memory core comprises a three-dimensional (3D) memory core that includes multiple memory cells arranged in multiple physical levels above a substrate and that includes circuitry associated with operation of the multiple memory cells; and
receiving, at the second semiconductor die, a representation of a codeword from the NAND flash memory core, wherein the representation of the codeword is received at periphery circuitry for the NAND flash memory core, wherein the periphery circuitry is within the second semiconductor die, and wherein the periphery circuitry generates the control signal to affect operation of the NAND flash memory core in response to receiving one or more commands from a memory controller on a third semiconductor die coupled to the second semiconductor die.

31. The method of claim 30, wherein the periphery circuitry includes at least one of a processor, an error correction coding (ECC) engine, a row decoder, a charge pump, and a multi-ported static random access memory (SRAM).

32. The method of claim 30, wherein the first semiconductor die lacks circuitry to generate the control signal, and wherein the first semiconductor die and the second semiconductor die do not include a memory controller.

* * * * *